United States Patent [19]

Igarashi et al.

[11] Patent Number: 5,327,097
[45] Date of Patent: Jul. 5, 1994

[54] GAIN CONTROL CIRCUIT

[75] Inventors: Sadao Igarashi; Kazuharu Aoki, both of Soma, Japan

[73] Assignee: Alps Electric Co., Ltd., Tokyo, Japan

[21] Appl. No.: 6,336

[22] Filed: Jan. 19, 1993

[30] Foreign Application Priority Data

Jan. 23, 1992 [JP] Japan .................................. 4-010389

[51] Int. Cl.$^5$ ........................... H03G 3/30; H03F 3/45
[52] U.S. Cl. ..................................... 330/254; 330/311
[58] Field of Search ........................... 330/69, 254, 311

[56] References Cited

U.S. PATENT DOCUMENTS 4,480,337  10/1984  Graziadei et al. .................. 455/333

FOREIGN PATENT DOCUMENTS 181310  10/1983  Japan .................................. 330/254

Primary Examiner—James B. Mullins
Attorney, Agent, or Firm—Guy W. Shoup; Patrick T. Bever

[57] ABSTRACT

There is provided a gain control circuit which comprises a circuit unit composed of a transistor $Q_{11}$, a first gain control unit 12 including transistors $Q_{12}$ and $Q_{13}$ having emitters connected to each other and a choke coil $L_1$ having an end connected to the collector of the transistor $Q_{12}$ and the other end connected to the collector of the transistor $Q_{13}$ for checking a high frequency signal current, and a second gain control unit 15 including transistors $Q_{14}$ and $Q_{15}$ having emitters connected to each other. Then, the transistor $Q_{11}$ of the circuit unit is connected to the node where the emitters of the first gain control unit 12 are connected to each other and the node where the transistor $Q_{13}$ of the first gain control unit 12 is connected to the choke coil $L_1$ is connected to the node where the emitters of the second gain control unit 15 are connected to each other, and a high frequency is input to the base of the transistor $Q_{11}$ of the circuit unit. With this arrangement, a power consumption is reduced and the distortion of an output signal is improved.

24 Claims, 16 Drawing Sheets

GAIN CONTROL CIRCUIT

BACKGROUND OF THE INVENTION

1. Field of the Invention

The present invention relates to a gain control circuit used in a car telephone, TV tuner and the like for controlling an input signal to a predetermined level and outputting the signal controlled to the predetermined level.

2. Description of the Related Art

FIG. 17 is a circuit diagram showing an example of the arrangement of a conventional gain control circuit, wherein reference character 1 designates an input terminal to which a high frequency signal voltage is input; reference character $C_1$ designates a direct current check capacitor; reference character $C_2$ designates a high frequency ground capacitor, reference characters $Q_1$ and $Q_2$ designate preamplifying transistors with similar characteristics; reference character 2 designates a constant voltage source for applying a bias voltage $V_1$; reference characters $R_1$ and $R_2$ designate resistors for applying the bias voltage, respectively; reference characters $R_3$ and $R_4$ designate current feedback resistors, respectively; and reference character $I_1$ designates a constant current source.

Further, reference character 3 designates a gain control voltage application terminal to which a gain control voltage is applied; reference characters 4 and 5 designate constant voltage sources for applying bias voltages $V_{CC}$ and $V_2$, respectively; reference characters $Q_3$, $Q_4$, $Q_5$ and $Q_6$ designate gain control transistors with similar characteristics, respectively; reference characters $R_5$ and $R_6$ designate load resistors, respectively; and reference characters $C_3$ and $C_4$ designate direct current check capacitors, respectively. Then. the transistors $Q_3$–$Q_6$ and load resistors $R_5$ and $R_6$ constitute a first gain control unit 6.

Further, reference characters $Q_7$, $Q_8$, $Q_9$ and $Q_{10}$ designate gain control transistors with similar characteristics, respectively; reference characters $I_2$ and $I_3$ designate constant current sources, respectively; reference characters $R_7$ and $R_8$ designate load resistors, respectively; reference character $C_5$ designates a direct current check capacitor; and reference character 7 designates an output terminal from which a gain-controlled high $Q_{10}$ and load resistors $R_7$ and $R_8$ constitute a second gain control unit 8.

In this arrangement, a gain control voltage is applied to the gain control voltage application terminal 3 based on the result of the detection of the signal voltage output from the gain control circuit and detected by a not shown circuit so that the signal voltage output from the gain control circuit is kept to a predetermined level.

First, when the gain of the gain control circuit is maximized (hereinafter, this is referred to as at the time of maximum gain), a voltage $(V_2+\Delta V)$ (V) is applied to the gain control voltage application terminal 3 as the gain control voltage.

With this arrangement, the transistors $Q_3$ and $Q_6$ of the first gain control unit 6 and the transistors $Q_7$ and $Q_{10}$ of the second gain control unit 8 are turned ON, respectively and collector direct currents $I_{C3}$, $I_{C6}$, $I_{C7}$ and $I_{C10}$ flow to the respective transistors $Q_3$, $Q_6$, $Q_7$ and $Q_{10}$. On the other hand, the transistors $Q_4$ and $Q_5$ of the first gain control unit 6 and the transistors $Q_8$ and $Q_9$ of the second gain control unit 8 are turned OFF, respectively, and thus a high frequency signal voltage is created to the resistors $R_5$–$R_8$.

Therefore, the high frequency signal voltage input from the input terminal 1 and is amplified through the capacitor $C_1$ by the differential operation of the transistors $Q_1$ and $Q_2$ and then amplified by the first gain control unit 6 having a gain controlled to a maximum value by the gain control voltage $(V_2+\Delta V)$ (V) applied to the gain control voltage application terminal 3.

Next, the signal voltage output from the first gain control unit 6 and is amplified through the capacitors $C_3$ and $C_4$ by the second gain control unit 8 having a gain controlled to a maximum value by the gain control voltage $(V_2+\Delta V)$ (V) applied to the gain control voltage application terminal 3 and then output from the output terminal 7 through the capacitor $C_5$.

On the other hand, when the gain of the gain control circuit is reduced (hereinafter, this is referred to as at the time of gain reduction), a voltage $(V_2-\Delta V)$ (V) is applied to the gain control voltage application terminal 3 as a gain control voltage.

With this arrangement, the transistors $Q_3$ and $Q_6$ of the first gain control unit 6 and the transistors $Q_7$ and $Q_{10}$ of the second gain control unit 8 are turned OFF, respectively and the collector direct currents $I_{C3}$, $I_{C6}$, $I_{C7}$ and $I_{C10}$ flowing to the respective transistors $Q_3$, $Q_6$, $Q_7$ and $Q_{10}$ are reduced to a very small amount. On the other hand, the transistors $Q_4$ and $Q_5$ of the first gain control unit 6 and the transistors $Q_8$ and $Q_9$ of the second gain control unit 8 are turned ON, respectively and collector direct currents $I_{C4}$, $I_{C5}$, $I_{C8}$ and $I_{C9}$ flow to the respective transistors $Q_4$, $Q_5$, $Q_8$ and $Q_9$.

Therefore, the high frequency signal voltage input from the input terminal 1 is amplified through the capacitor $C_1$ by the differential operations of the transistors $Q_1$ and $Q_2$ and attenuated by the first gain control unit 6 having a gain reduced by the gain control voltage $(V_2-\Delta V)$ (V) applied to the gain control voltage application terminal 3.

Next, a small amount of the signal voltage output from the first gain control unit 6 is further attenuated through the capacitors $C_3$ and $C_4$ by the second gain control unit 8 having a gain further reduced by the gain control voltage $(V_2-\Delta V)$ (V) applied to the gain control voltage application terminal 3 and then output from the output terminal 7 through the capacitor $C_5$.

As described above, the signal voltage output from the gain control circuit is kept to a predetermined level by applying a voltages from $(V_2-\Delta V)$ (V) to $(V_2+\Delta V)$ (V) to the gain control voltage application terminal 3 as the gain control voltage in accordance with the high frequency signal voltage output from the output terminal 7.

Incidentally, the aforesaid conventional gain control circuit has a drawback that a large amount of power is consumed because the collector direct currents flow in parallel to the transistors $Q_3$–$Q_{10}$ at all times.

An object of the present invention made under the above background is to provide a gain control circuit by which a power consumption can be reduced.

SUMMARY OF THE INVENTION

A gain control circuit according to the present invention comprises a current dividing type gain control unit including first and second transistors having emitters connected to each other, a high frequency check means having one end connected to the collector of the first transistor and the other end connected to the collector of the second transistor for checking a high frequency signal current, an input terminal composed of the node where the emitters are connected to each other for causing an emitter direct current to be conducted therethrough and a signal current also to be input thereto, an output terminal composed of the node where the collector of the first or second transistor is connected to the high frequency check means for causing a collector direct current also to be conducted therethrough and a signal current to be output therefrom, and a means for changing the dividing ratio of the collector direct current to the first and second transistors, whereby gain is controlled by the dividing ratio; and a rear stage circuit unit including at least one transistor having an emitter connected to the output terminal of the gain control unit and a collector serving as an output terminal.

Further, a gain control circuit according to the present invention comprises a current dividing type gain control unit including first and second transistors having emitters connected to each other, a high frequency check means having one end connected to the collector of the first transistor and the other end connected to the collector of the second transistor for checking a high frequency signal current, an input terminal composed of the node where the emitters are connected to each other for causing an emitter direct current to be conducted therethrough and a signal current also to be input thereto, an output terminal composed of the node where the collector of the first or second transistor is connected to the high frequency check means for causing a collector direct current to be conducted therethrough and a signal current also to be output therefrom and a means for changing the dividing ratio of the collector direct current to the first and second transistors, whereby gain is controlled by the dividing ratio; and a second current dividing type gain control unit composed of third and fourth transistors having emitters connected to the output terminal of the current dividing type gain control unit and the node where the emitters are connected to each other serves as an input terminal for causing an emitter direct current to be conducted therethrough and a signal current also to be input thereto.

The high frequency check means may be composed of a choke coil(s), a resistor(s) or transistors.

With the above arrangement, when, for example, the output terminal of the circuit unit as a first stage is connected to the input terminal of the gain control unit as a second stage and the output terminal of the second stage gain control unit is connected to the input terminal of the gain control unit as a final stage and then a high frequency signal is input to the input terminal of the first stage circuit unit as well as the dividing ratio of the collector direct current of the first and second transistors of the gain control unit of each stage is adjusted, the gain of the gain control unit of each stage is controlled as well as a common collector direct current flows to each circuit and thus a high frequency signal of a desired level is output from the output terminal of the final stage gain control unit.

DESCRIPTION OF PREFERRED EMBODIMENTS

An embodiment of the present invention will be described with reference to the drawings.

Figure 1:
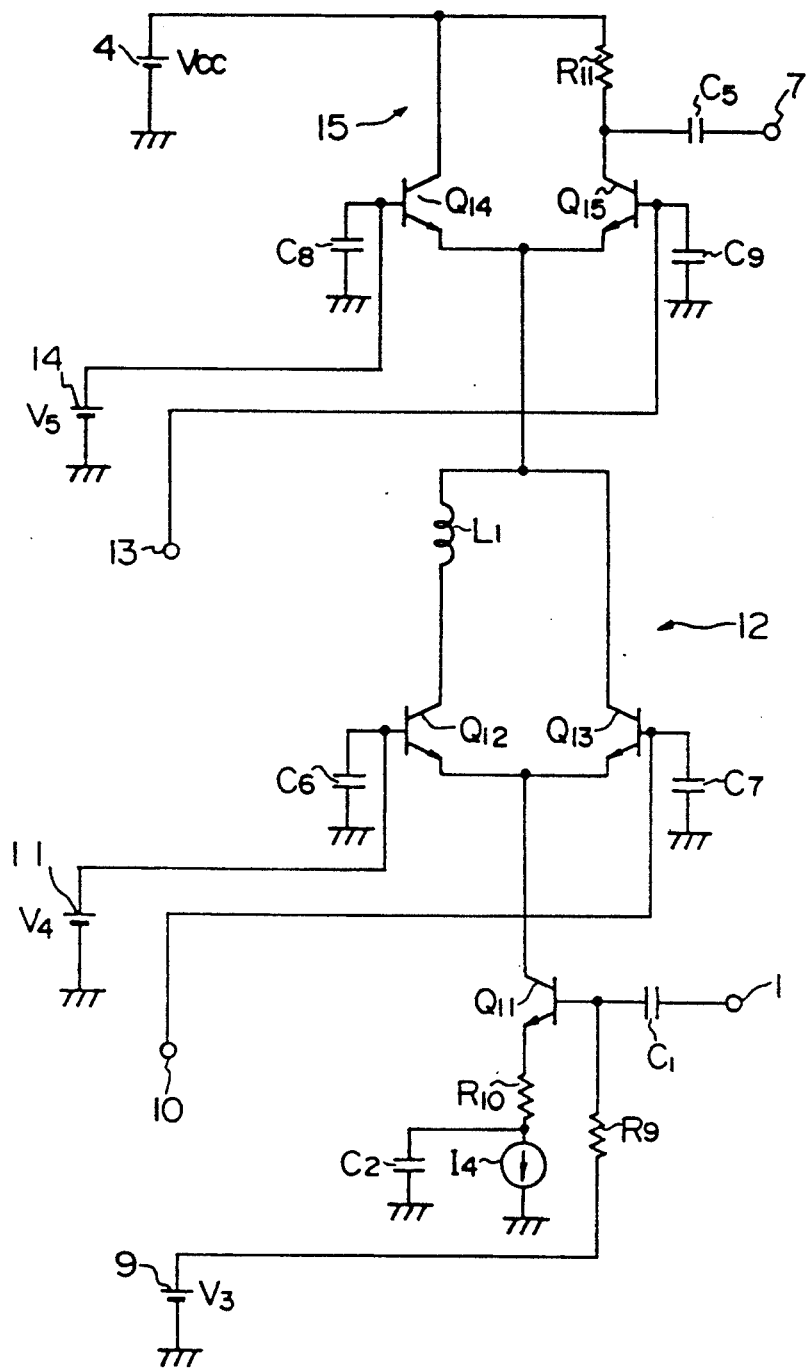
FIG. 1 is a circuit diagram showing the arrangement of the gain control circuit of a first embodiment according to the present invention.
Figure 17:
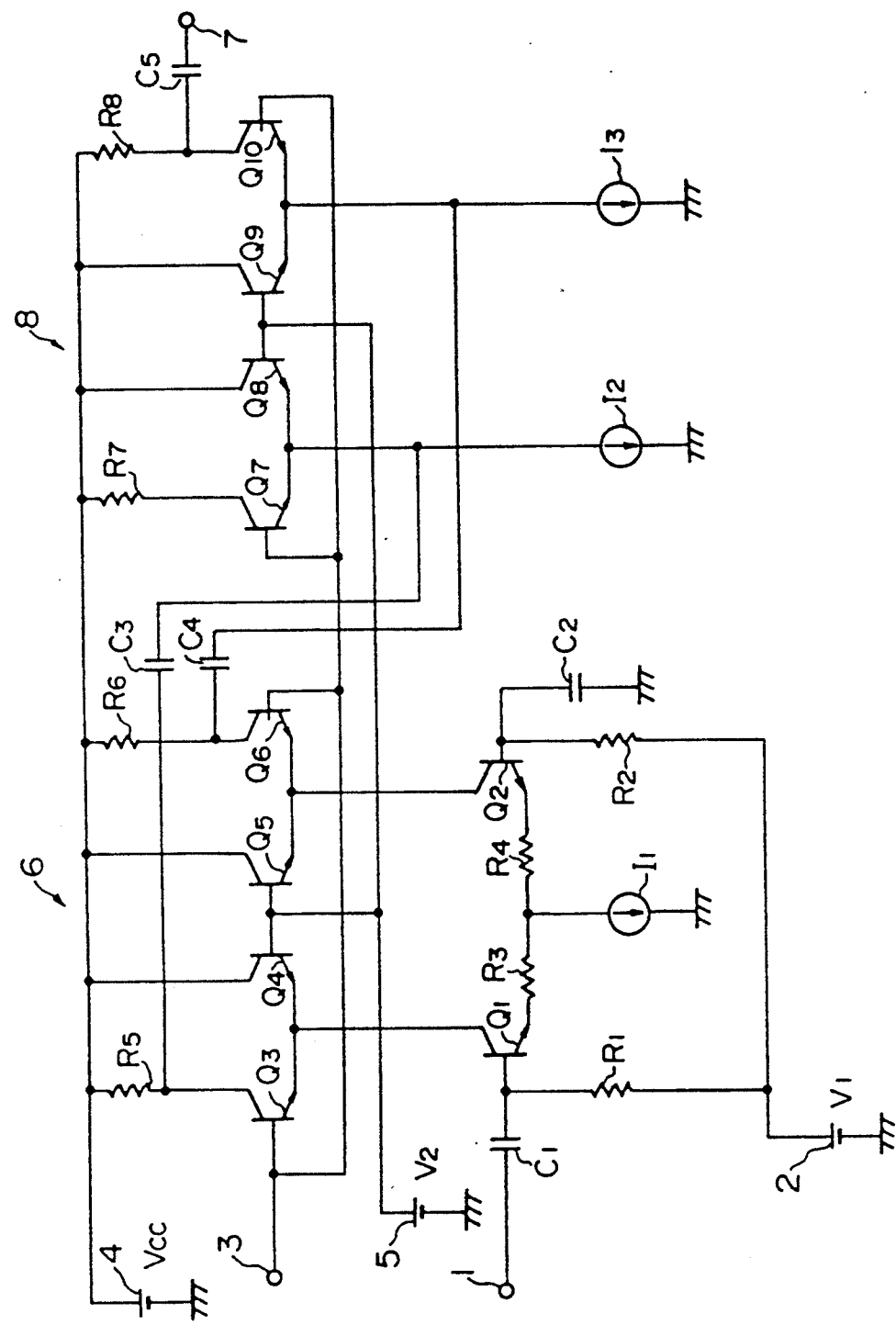
FIG. 17 is a circuit diagram showing the arrangement of a conventional gain control circuit.

FIG. 1 is a circuit diagram showing the arrangement of the gain control circuit of this embodiment according to the present invention, wherein the same reference characters are used to the parts corresponding to the respective parts of FIG. 17 and the description thereof is omitted. In FIG. 1, reference character $Q_{11}$ designates a preamplifying transistor; reference character 9 designates a constant voltage source for applying a bias voltage $V_3$; reference character R9 designates a resistor for applying the bias voltage; reference character $R_{10}$ designates a current feedback resistor; and reference character $I_4$ designates a constant current source.

Further, reference character 10 designates a gain control voltage application terminal to which a first gain control voltage is applied; reference character 11 designates a constant voltage source for applying a bias voltage $V_4$; reference characters $Q_{12}$ and $Q_{13}$ designate gain control transistors with similar characteristics, respectively; reference character L1 designates a high frequency check choke coil: reference characters $C_6$ and $C_7$ designate high frequency ground capacitors, respectively. The constant voltage source 11, transistors $Q_{12}$ and $Q_{13}$, choke coil $L_1$ and capacitors $C_6$ and $C_7$ constitute a first gain control unit 12.

Further, reference character 13 designates a gain control voltage application terminal to which a second gain control voltage is applied; reference character 14 designates a constant voltage source for applying a bias voltage $V_5$; reference characters $Q_{14}$ and $Q_{15}$ designate gain control transistors with similar characteristics, respectively; reference characters $C_8$ and $C_9$ designate high frequency ground capacitors, respectively; and reference character $R_{11}$ designates a load resistor. The constant voltage source 14, transistors $Q_{14}$ and $Q_{15}$, capacitors $C_8$ and $C_9$ and load resistor $R_{11}$ constitute a second gain control unit 15.

In this arrangement, first, at the time of maximum gain, a voltage $(V_4+\Delta V)$ (V) is applied to the gain control voltage application terminal 10 as a gain control voltage and a voltage $(V_5+\Delta V)$ (V) is applied to the gain control voltage application terminal 13 the gain control voltage.

As a result, the transistor $Q_{13}$ of the first gain control unit 12 and the transistor $Q_{15}$ of the second gain control unit 15 are turned ON, respectively, whereas the transistor $Q_{12}$ of the first gain control unit 12 and the transistor $Q_{14}$ of the second gain control unit 15 are turned OFF, respectively.

Therefore, a collector direct current $I_{C15}$ flows to the transistor $Q_{15}$ of the second gain control unit 15 and a collector direct current $I_{C14}$ slightly flows to the transistor $Q_{14}$ thereof. Then, the sum of the collector direct currents $(I_{C14}+I_{C15})$ is supplied to the first gain control unit 12 and thus a collector direct current $I_{C13}$ flows to the transistor $Q_{13}$ of the first gain control unit 12 and a collector direct current $I_{C12}$ slightly flows to the transistor $Q_{12}$ thereof. Then, the sum of these collector direct currents $(I_{C12}+I_{C13})$ is supplied to the transistor $Q_{11}$ as a collector direct current $I_{C11}$.

In this case, the collector direct current $I_{C11}$ flowing to the transistor $Q_{11}$ has a constant value due to the existence of the constant current source $I_4$ and thus the sum of the collector direct currents $(I_{C12}+I_{C13})$ flowing to the respective transistors $Q_{12}$ and $Q_{13}$ has a constant value.

As a result, a high frequency signal voltage input from an input terminal 1 is amplified by the transistor $Q_{11}$ through a capacitor $C_1$ and then amplified by the first gain control unit 12 having a gain controlled to a maximum value by the gain control voltage $(V_4+\Delta V)$ (V) applied to the gain control voltage application terminal 10.

Next, a signal voltage output from the first gain control unit 12 is amplified by the second gain control unit 15 having a gain controlled to a maximum value by the gain control voltage $(V_5+\Delta V)$ (V) applied to the gain control voltage application terminal 13 and then output from an output terminal 7 through a capacitor $C_5$.

On the other hand, at the time of gain reduction, a voltage $(V_4-\Delta V)$ (V) is applied to the gain control voltage application terminal 10 as a gain control voltage and a voltage $(V_5-\Delta V)$ (V) is applied to the gain control voltage application terminal 13 as the gain control voltage.

As a result, the transistor $Q_{13}$ of the first gain control unit 12 and the transistor $Q_{15}$ of the second gain control unit 15 are turned OFF, respectively, whereas the transistor $Q_{12}$ of the first gain control unit 12 and the transistor $Q_{14}$ of the second gain control unit 15 are turned ON, respectively.

Therefore, the collector direct current $I_{C14}$ flows to the transistor $Q_{14}$ of the second gain control unit 15 and the collector direct current $I_{C15}$ slightly flows to the transistor $Q_{15}$. Then, the sum of these collector direct currents $(I_{C14}+I_{C15})$ is supplied to the first gain control unit 12 and thus the collector direct current $I_{C12}$ flows to the transistor $Q_{12}$ of the first gain control unit 12 and the collector direct current $I_{C13}$ slightly flows to the transistor $Q_{13}$ thereof. Then, the sum of these collector direct currents $(I_{C12}+I_{C13})$ is supplied to the transistor $Q_{11}$ as the collector direct current $I_{C11}$.

As a result, the high frequency signal voltage input from the input terminal 1 is amplified by the transistor $Q_{11}$ through the capacitor 1 and then attenuated by the first gain control unit 12 having a gain reduced by the gain control voltage $(V_4-\Delta V)$ (V) applied to the gain control voltage application terminal 10 with its high frequency component sufficiently checked by the choke coil $L_1$.

Next, the slight amount of a signal voltage output from the first gain control unit 12 is further attenuated by the second gain control unit 15 having a gain reduced by the gain control voltage $(V_5-\Delta V)$ (V) applied to the gain control voltage application terminal 13 and then output from the output terminal 7 through the capacitor $C_5$.

As described above, the signal voltage output from the gain control circuit is kept to a predetermined level by applying a voltage from $(V_4-\Delta V$ (V)) to $(V_4+\Delta V)$ (V) to the gain control voltage application terminal 10 as the gain control voltage as well as applying a voltage from $(V_5-\Delta V)$ (V) to $(V_5+\Delta V)$ (V) to the gain control voltage application terminal 13 as the gain control voltage, in accordance with the high frequency signal voltage output from the output terminal 7.

An amount of attenuation $G_r$ (dB) of the gain control circuit will be shown below when the transistors $Q_{13}$ and $Q_{15}$ have the similar characteristics. Since the transistors $Q_{13}$ and $Q_{15}$ have the similar characteristics, the collector direct current $I_{C13}$ flowing to the transistor $Q_{13}$ is the same as the collector direct current $I_{C15}$ flowing to the transistor $Q_{15}$ and these collector direct currents $I_{C13}$ and $I_{C15}$ are expressed by the following formula.

$$I_{C13}=I_{C15}=I_S \times exp\ (V_{BE}/V_t) \qquad (1)$$

$$V_t = (k \times T/q) \qquad (2)$$

In the formulas (1) and (2), $I_S$ represents a collector saturation current of the transistors; $V_t$ represents a thermal voltage; k represents a Boltzmann constant; T represents an absolute temperature; and q represents a charge.

Figure 2:
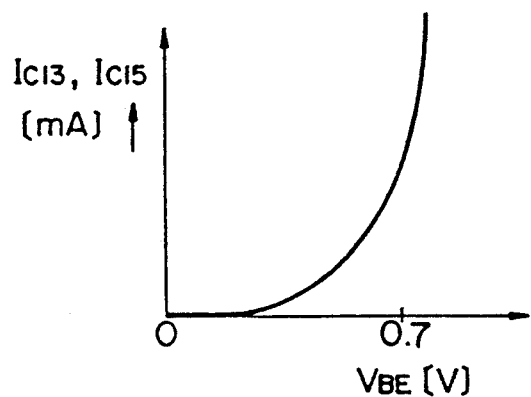
FIG. 2 is a diagram showing an example of the characteristics of collector direct currents $I_{C13}$ and $I_{C15}$ to a base to emitter voltage $V_{BE}$.

FIG. 2 shown an example of the characteristics of the collector direct currents $I_{C13}$ and $I_{C15}$ to a base to emitter voltage $V_{BE}$.

Further, an amount of attenuation $G_r$ of the transistors $Q_{13}$ and $Q_{15}$ to the collector direct currents $I_{C13}$ and $I_{C15}$ is expressed by the following formula.

$$G_r = 20\ log\ (I_{C13G}/I_{C13F})+20\ log\ (I_{C15G}/I_{C15F}) \qquad (3)$$

In the formula (3), $I_{C13G}$ represents the value of the collector direct current of the transistor $Q_{13}$ when the gain thereof is controlled; $I_{C13F}$ represents the value of the collector direct current of the transistor $Q_{13}$ when the maximum gain thereof is achieved; $I_{C15G}$ represents the value of the collector direct current of the transistor $Q_{15}$ when the gain thereof is controlled; and $I_{C15F}$ represents the value of the collector direct current of the transistor $Q_{15}$ when the maximum gain thereof is achieved.

As described above, since the amount of attenuation $G_r$ is expressed as the function of the collector direct currents $I_{C13}$ and $I_{C15}$ of the transistors $Q_{13}$ and $Q_{15}$ and further the collector direct currents $I_{C13}$ and $I_{C15}$ are expressed by the function of the base to emitter voltage $V_{BE}$, a gain can be controlled by applying the gain control voltages to the gain control voltage application terminals 10 and 13 so as to obtain a desired amount of attenuation $G_r$.

Figure 3:
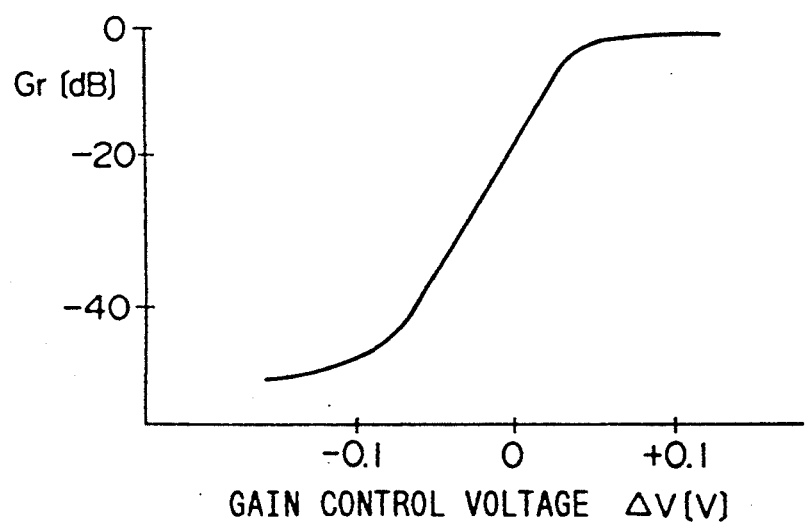
FIG. 3 is a diagram showing an example of the characteristics of an attenuation amount $G_r$ to a gain control voltage $\Delta V$.

FIG. 3 shows an example of the characteristics of the amount of attenuation $G_r$ to a gain control voltage V. The curve of FIG. 3 shows that the portion of the amount of attenuation $G_r$ becomes 0 (dB) at the time of maximum gain, and in this example the amount of attenuation $G_r$ changes from about 50 (dB) to about 0 (dB) by applying a voltage from ($V_4$−about 0.1) (V) to ($V_4$+about 0.1) (V) to the gain control voltage application terminal 10 as the gain control voltage and a voltage from ($V_5$−about 0.1) (V) to ($V_5$+about 0.1) (V) to the gain control voltage application terminal 13 as the gain control voltage.

Further, in the aforesaid first embodiment, since a common collector direct current flows to the first and second gain control units 12 and 15 and the choke coil $L_1$ is used as the output stage of the first gain control unit 12, the collector direct currents ($I_{C14}+I_{C15}$) of the two transistors $Q_{14}$ and $Q_{15}$ can be gathered and flown to the transistors $Q_{12}$ and $Q_{13}$, and thus a power consumption can be greatly reduced as compared with prior art. Further, the distortion of a high frequency signal can be improved.

Figure 4:
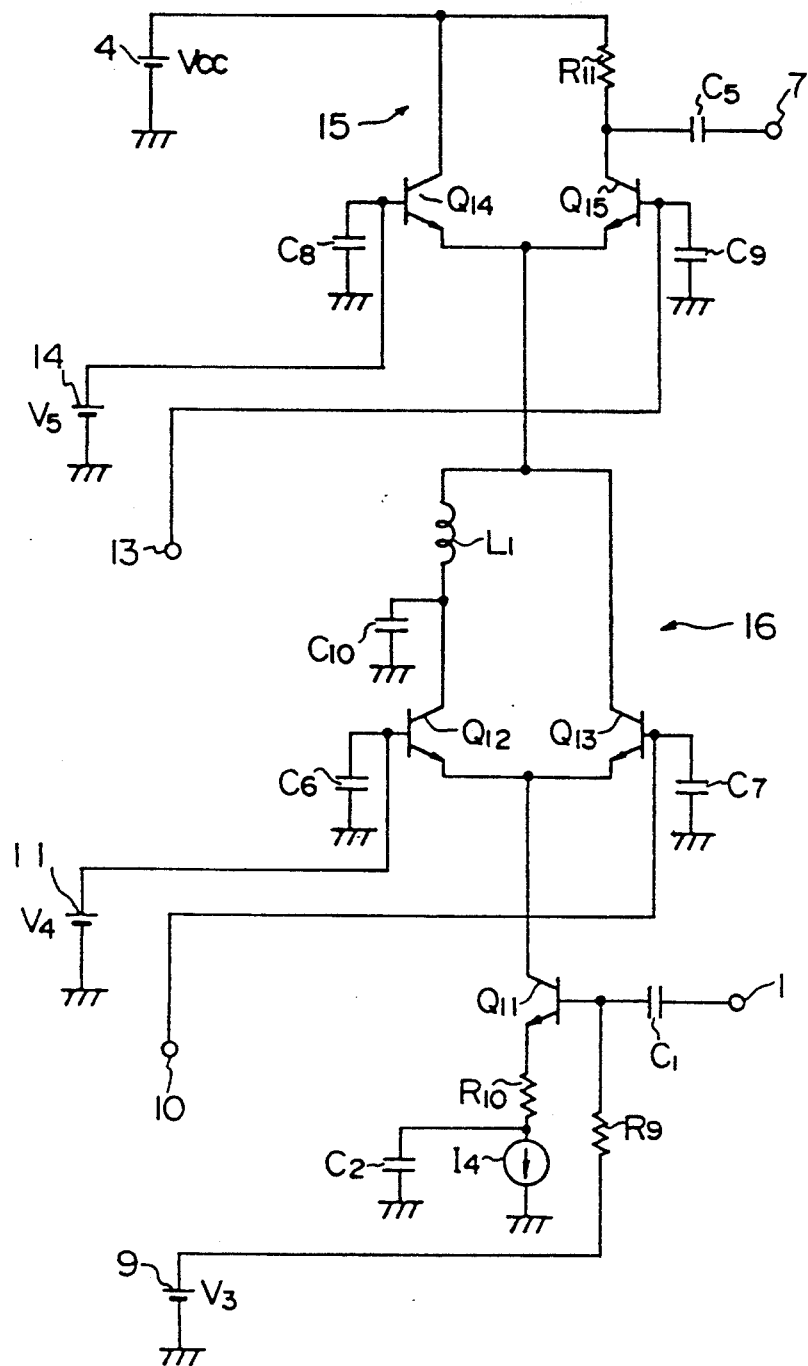
FIG. 4 is a circuit diagram showing the arrangement of the gain control circuit of a second embodiment according to the present invention.

Next, a second embodiment of the present invention will be described. FIG. 4 is a circuit diagram showing the arrangement of the gain control circuit of the second embodiment according to the present invention, wherein the same reference characters are used to the parts corresponding to the respective parts of FIG. 1 and the description thereof is omitted. The gain control circuit shown in FIG. 4 is provided with a first gain control unit 16 in place of the first gain control unit 12 and the gain control unit 16 has a high frequency ground capacitor $C_{10}$ interposed between the node where an end of a choke coil $L_1$ is connected to the collector of a transistor $Q_{12}$ and ground.

Since the operation at the time of maximum gain of the second embodiment arranged as described above is substantially the same as that of the aforesaid first embodiment, the description thereof is omitted.

At the time of gain reduction, a voltage ($V_4$−$\Delta V$) (V) is applied to a gain control voltage application terminal 10 as a gain control voltage and a voltage ($V_5$−$\Delta V$) (V) is applied to a gain control voltage application terminal 13 as the gain control voltage.

As a result, the transistor $Q_{13}$ of the first gain control unit 16 and the transistor $Q_{15}$ of a second gain control unit 15 are turned OFF, respectively, whereas the transistor $Q_{12}$ of the first gain control unit 16 and the transistor $Q_{14}$ of the second gain control unit 15 are turned ON, respectively.

A high frequency signal voltage input from an input terminal 1 is amplified by a transistor $Q_{11}$ through a capacitor $C_1$ and then attenuated by the first gain control unit 16 having a gain reduced by the gain control voltage ($V_4$−$\Delta V$) (V) applied to the gain control voltage application terminal 10 with its high frequency component more sufficiently checked by the choke coil $L_1$ and capacitor $C_{10}$ as compared with the case of the first embodiment.

Next, a slight amount of the signal voltage output from the first gain control unit 16 is further attenuated by the second gain control unit 15 having a gain reduced by the gain control voltage ($V_5$−$\Delta V$) (V) applied to the gain control voltage application terminal 13 and then output from an output terminal 7 through a capacitor $C_5$.

As described above, according to the aforesaid second embodiment, since the capacitor $C_{10}$ is also provided with the first gain control unit 16 in addition to the choke coil $L_1$ of the first embodiment, an amount of attenuation is greater than that of the first embodiment at the time of gain reduction.

Figure 5:
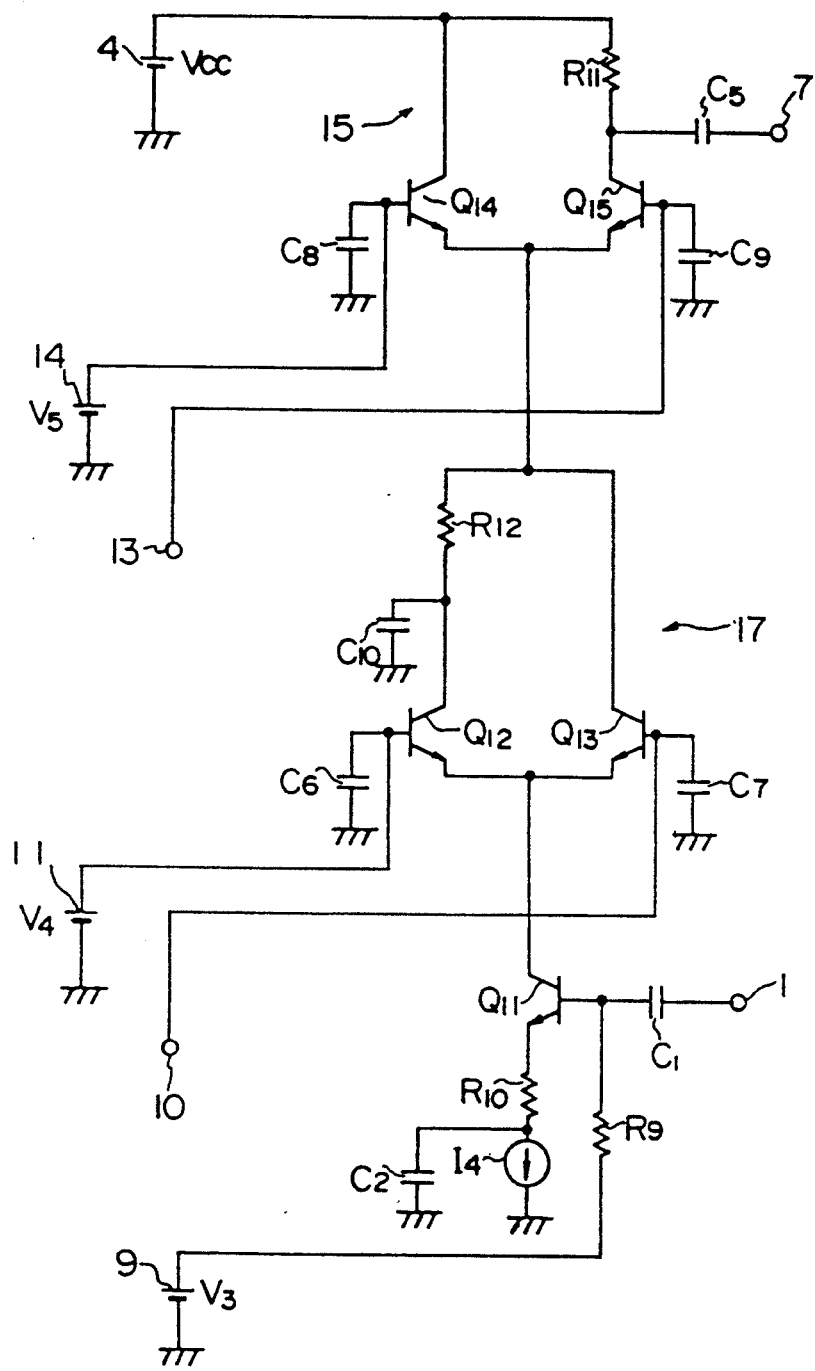
FIG. 5 is a circuit diagram showing the arrangement of the gain control circuit of a third embodiment according to the present invention.

Next, a third embodiment of the present invention will be described. FIG. 5 is a circuit diagram showing the arrangement of the gain control circuit of the third embodiment according to the present invention, wherein the same reference characters are used to the parts corresponding to the respective parts of FIG. 4 and the description thereof is omitted. The gain control circuit shown in FIG. 5 is provided with a first gain control unit 17 in place of the first gain control unit 16 and the gain control unit 17 has a high frequency check resistor $R_{12}$ in place of the choke coil $L_1$.

Since the operation at the time of maximum gain of the third embodiment arranged as described above is substantially the same as that of the aforesaid first embodiment, the description thereof is omitted.

At the time of gain reduction, a voltage ($V_4$−$\Delta V$) (V) is applied to a gain control voltage application terminal 10 as a gain control voltage and a voltage ($V_5$−$\Delta V$) (V) is applied to a gain control voltage application terminal 13 as the gain control voltage.

As a result, the transistor $Q_{13}$ of the first gain control unit 17 and the transistor $Q_{15}$ of a second gain control unit 15 are turned OFF, respectively, whereas the transistor $Q_{12}$ of the first gain control unit 17 and the transistor $Q_{14}$ of the second gain control unit 15 are turned ON, respectively.

A high frequency signal voltage input from an input terminal 1 is amplified by a transistor $Q_{11}$ through a capacitor $C_1$ and then attenuated by the first gain control unit 17 having a gain reduced by the gain control voltage ($V_4$−$\Delta V$) (V) applied to the gain control voltage application terminal 10 with its high frequency component sufficiently checked by the resistor $R_{12}$ and capacitor $C_{10}$, in the same way as the second embodiment.

Next, a slight amount of the signal voltage output from the first gain control unit 17 is further attenuated by the second gain control unit 15 having a gain reduced by the gain control voltage ($V_5$−$\Delta V$) (V) applied to the gain control voltage application terminal 13 and then output from an output terminal 7 through a capacitor $C_5$.

As described above, according to the aforesaid third embodiment, since the resistor $R_{12}$ is provided in place of the choke coil $L_1$ of the second embodiment, an amount of attenuation is greater than that of the first embodiment 1 at the time of gain reduction, in the same way as the second embodiment.

Figure 6:
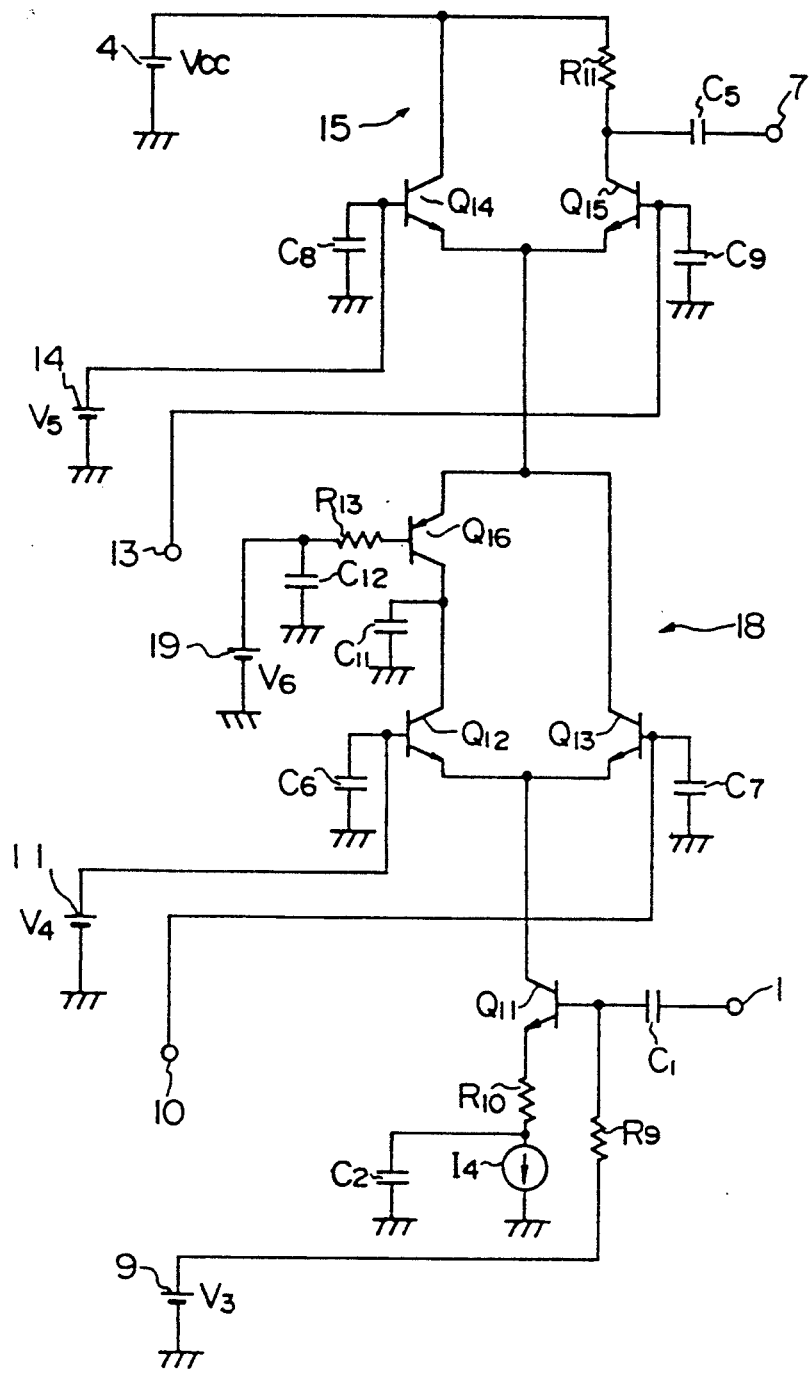
FIG. 6 is a circuit diagram showing the arrangement of the gain control circuit of a fourth embodiment according to the present invention.

Next, a fourth embodiment of the present invention will be described. FIG. 6 is a circuit diagram showing the arrangement of the gain control circuit of the fourth embodiment according to the present invention, wherein the same reference characters are used to the parts corresponding to the respective parts of FIG. 1 and the description thereof is omitted. The gain control circuit shown in FIG. 6 is provided with a first gain control unit 18 in place of the first gain control unit 12.

In the first gain control unit 18, reference character $Q_{16}$ designates a high frequency check PNP transistor; reference character 19 designates a constant voltage source for applying a bias voltage $V_6$; reference character $R_{13}$ designates a resistor for applying the bias voltage; and reference characters $C_{11}$ and $C_{12}$ designate high frequency ground capacitors.

In this arrangement, first, at the time of maximum gain, a voltage $(V_4+\Delta V)$ (V) is applied to a gain control voltage application terminal 10 as a gain control voltage and a voltage $(V_5+\Delta V)$ (V) is applied to a gain control voltage application terminal 13 as the gain control voltage.

As a result, the transistor $Q_{13}$ of the first gain control unit 18 and the transistor $Q_{15}$ of a second gain control unit 15 are turned ON, respectively, whereas the transistors $Q_{12}$ and $Q_{16}$ of the first gain control unit 18 and the transistor $Q_{14}$ of the second gain control unit 15 are turned OFF, respectively.

Therefore, a collector direct current $I_{C15}$ flows to the transistor $Q_{15}$ of the second gain control unit 15 and a collector direct current $I_{C14}$ slightly flows to the transistor $Q_{14}$ thereof. Then, the sum of these collector direct currents $(I_{C14}+I_{C15})$ is supplied to the first gain control unit 18.

Next, although a collector direct current $I_{C13}$ flows to the transistor $Q_{13}$ of the first gain control unit 18, a collector direct current $I_{C12}$ slightly flows to the transistor $Q_{12}$ thereof and the slight amount of the collector direct current $I_{C12}$ flows to the transistors $Q_{16}$ as a collector direct current $I_{C16}$.

Then, the sum of these collector direct currents $(I_{C12}+I_{C13})$ is supplied to the transistor $Q_{11}$ as a collector direct current $I_{C11}$. In this case, the collector direct current $I_{C11}$ flowing to the transistor $Q_{11}$ has a constant value due to the existence of a constant current source 14 and thus the sum of the collector direct currents $(I_{C12}+\text{and } I_{C13})$ flowing to the transistors $Q_{12}$ and $Q_{13}$, respectively, has a constant value.

As a result, a high frequency signal voltage input from an input terminal 1 is amplified by a transistor 11 through a capacitor $C_1$ and then amplified by the first gain control unit 18 having a gain controlled to a maximum value by the gain control voltage $(V_4+\Delta V)$ (V) applied to the gain control voltage application terminal 10. Note, as described above, since the transistors $Q_{12}$ and $Q_{16}$ are turned OFF, an input impedance to the high frequency signal of the emitter of the transistor $Q_{16}$ is higher than that of the second gain control unit 15 as a rear stage, and thus the maximum gain of the first gain control unit 18 is not deteriorated as compared with that of the aforesaid first embodiment.

Next, the signal voltage output from the first gain control unit 18 is amplified by the second gain control unit 15 having a gain controlled to a maximum value by the gain control voltage $(V_5+\Delta V)$ (V) applied to the gain control voltage application terminal 13 and then output from an output terminal 7 through a capacitor $C_5$.

On the other hand, a voltage $(V_4-\Delta V)$ (V) is applied to the gain control voltage application terminal 10 as a gain control voltage and a voltage $(V_5-\Delta V)$ (V) is applied to the gain control voltage application terminal 13 as the gain control voltage at gain reduction and a voltage $(V_5-\Delta V)$ (V) is applied to the gain control voltage application terminal 13 as the gain control voltage.

As a result, the transistor $Q_{13}$ of the first gain control unit 18 and the transistor $Q_{15}$ of the second gain control unit 15 are turned OFF, respectively, whereas the transistors $Q_{12}$ and $Q_{16}$ of the first gain control unit 18 and the transistor $Q_{14}$ of the second gain control unit 15 are turned ON, respectively.

Therefore, the collector direct current $I_{C14}$ flows to the transistor $Q_{14}$ of the second gain control unit 15 and the collector direct current $I_{C15}$ slightly flows to the transistor $Q_{15}$ thereof. Then, the sum of these collector direct currents $(I_{C14}+I_{C15})$ is supplied to the first gain control unit 18.

Next, the collector direct current $I_{C16}$ flows to the transistor $Q_{16}$ of the first gain control unit 18, and the collector direct current $I_{C16}$ flows to the transistor $Q_{12}$ as the collector direct current $I_{C12}$. Further, the collector direct current $I_{C13}$ slightly flows to the transistor $Q_{13}$. Then, the sum of these collector direct currents $(I_{C12}+I_{C13})$ is supplied to the transistor $Q_{11}$ as the collector direct current $I_{C11}$.

As a result, the high frequency signal voltage input from the input terminal 1 is amplified by the transistor $Q_{11}$ through the capacitor $C_1$ and then attenuated by the first gain control unit 18 having a gain reduced by the gain control voltage $(V_4-\Delta V)$ (V) applied to the gain control voltage application terminal 10. In this case, the high frequency signal voltage is sufficiently checked by the reverse direction transmission characteristics of the transistor $Q_{16}$ having a collector connected to the signal input side and the high frequency ground capacitors $C_{11}$ and $C_{12}$.

Next, the signal voltage slightly output from the first gain control unit 18 is further attenuated by the second gain control unit 15 having a gain reduced by the gain control voltage $(V_5-\Delta V)$ (V) applied to the gain control voltage application terminal 13 and then output from the output terminal 7 through the capacitor $C_5$.

As described above, according to the aforesaid fourth embodiment, since the transistor $Q_{16}$, high frequency ground capacitors $C_{11}$ and $C_{12}$, resistor $R_{13}$ and constant voltage source 19 are provided in place of the choke coil $L_1$ of the first embodiment, a maximum gain at the time of maximum gain is greater than that of the first embodiment.

Figure 7:
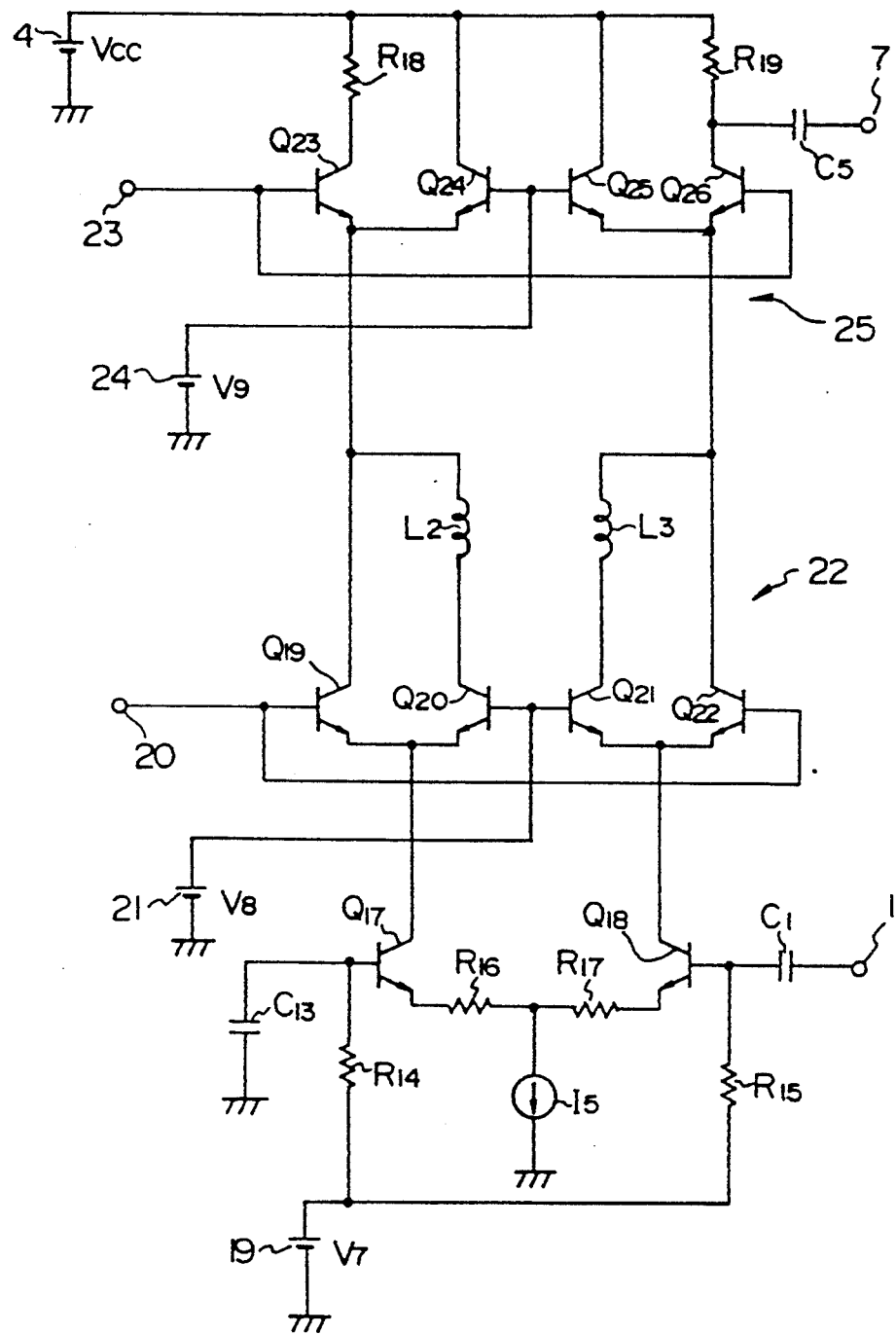
FIG. 7 is a circuit diagram showing the arrangement of the gain control circuit of a fifth embodiment according to the present invention.

Next, a fifth embodiment of the present invention will be described. FIG. 7 is a circuit diagram showing the arrangement of the gain control circuit of the fifth embodiment according to the present invention, wherein the same reference characters are used to the parts corresponding to the respective parts of FIG. 1 and the description thereof is omitted. In FIG. 7, reference characters $Q_{17}$ and $Q_{18}$ designate a preamplifying transistors with similar characteristics; reference character 19 designates a constant voltage source for applying a bias voltage $V_7$; reference characters $R_{14}$ and $R_{15}$ are resistors for applying the bias voltage, respectively; reference characters $R_{16}$ and $R_{17}$ designate current feedback resistors, respectively; reference character $I_5$ designates a constant current source; and reference character $C_{13}$ designates a high frequency ground capacitor.

Further, reference character 20 designate a gain control voltage application terminal to which a first gain control voltage is applied; reference character 21 designate a constant voltage source for applying a bias voltage $V_8$; reference character $Q_{19}$, $Q_{20}$, $Q_{21}$ and $Q_{22}$ designate gain control transistors with similar characteristics, respectively; and reference characters $L_2$ and $L_3$ are high frequency check coils, respectively. Then, the constant voltage source 21, transistors $Q_{19}$–$Q_{22}$ and choke coils $L_2$ and $L_3$ constitute a first gain control unit 22.

Further, reference character 23 designates a gain control voltage application terminal to which a second gain control voltage is applied; reference character 24 designate a constant voltage source for applying a bias voltage $V_9$; reference characters $Q_{23}$, $Q_{24}$, $Q_{25}$ and $Q_{26}$ designate gain control transistors with similar characteristics, respectively; and reference characters $R_{18}$ and $R_{19}$ designate load resistors, respectively. Then, the constant voltage source 24, transistors $Q_{23}$–$Q_{26}$ and load resistors $R_{18}$ and $R_{19}$ constitute a second gain control unit 25.

In this arrangement, first, at the time of maximum gain, a voltage $(V_8+\Delta V)$ (V) is applied to the gain control voltage application terminal 20 as a gain control voltage and a voltage $(V_9+\Delta V)$ (V) is applied to the gain control voltage application terminal 23 as the gain control voltage.

As a result, the transistors $Q_{19}$ and $Q_{22}$ of the first gain control unit 22 and the transistors $Q_{23}$ and $Q_{26}$ of the second gain control unit 25 are turned ON, respectively, whereas the transistors $Q_{20}$ and $Q_{21}$ of the first gain control unit 22 and the transistors $Q_{24}$ and $Q_{25}$ of the second gain control unit 25 are turned OFF, respectively.

Therefore, collector direct currents $I_{C23}$ and $I_{C26}$ flow to the transistors $Q_{23}$ and $Q_{26}$ of the second gain control unit 25, respectively, and collector direct currents $I_{C24}$ and $I_{C25}$ slightly flow to the transistor $Q_{24}$ and $Q_{25}$ thereof.

Then, the sums of these collector direct currents $(I_{C23}+I_{C24})$ and $(I_{C25}+I_{C26})$ are supplied to the first gain control unit 22, the collector direct currents $I_{C19}$ and $I_{C22}$ flow to the transistors $Q_{19}$ and $Q_{22}$ of the first gain control unit 22, respectively and collector direct currents $I_{C20}$ and $I_{C21}$ slightly flow to the transistors $Q_{20}$ and $Q_{21}$ thereof, respectively.

Then, the sums of these collector direct currents $(I_{C19}+I_{C20})$ and $(I_{C21}+I_{C22})$ are supplied to the transistors $Q_{17}$ and $Q_{18}$ as collector direct currents $I_{C17}$ and $I_{C17}$, respectively.

In this case, the sum of the collector direct current $(I_{C17}+I_{C18})$ flowing to the transistor $Q_{17}$ and $Q_{18}$, respectively has a constant value due to the existence of the constant current source $I_5$.

As a result, a high frequency signal voltage input from an input terminal 1 is amplified through a capacitor $C_1$ by the differential operation of the transistors $Q_{17}$ and $Q_{18}$ to which collector high frequency signal currents having a negative phase to each other flow and then amplified by the first gain control unit 22 having a gain controlled to a maximum value by the gain control voltage $(V_8+\Delta V)$ (V) applied to the gain control voltage application terminal 20.

In this case, since the base of the transistor $Q_{19}$ is connected to the base of the transistor $Q_{22}$ and the base of the transistor $Q_{20}$ is connected to the base of the transistor $Q_{21}$, collector high frequency signal currents having a negative phase to each other flow to the transistors $Q_{19}$ and $Q_{22}$ and base currents flowing to the nodes of these bases have a constant value, and in the same way collector high frequency signal currents having a negative phase to each other slightly flow to the transistors $Q_{20}$ and $Q_{21}$ and base currents flowing to the nodes of these bases have a constant value.

Therefore, since the base current of each of the transistors $Q_{19}$–$Q_{22}$ has a constant value regardless of the impedance of a base bias supply unit, the respective base nodes serve as an intermediate point in terms of high frequency, that is, they are as if grounded in terms of the high frequency and thus the first gain control unit 22 operates as a base ground circuit in high frequency.

Next, the signal voltage output from the first gain control unit 22 is amplified by the second gain control unit 25 having a gain controlled to a maximum value by the gain control voltage $(V_9+\Delta V)$ (V) applied to the gain control voltage application terminal 23 and then output from an output terminal 7 through a capacitor $C_5$. The second gain control unit 25 also operates as a base ground circuit in a high frequency in the same way as the first gain control unit 22.

On the other hand, at the time of gain reduction, a voltage $(V_8-\Delta V)$ (V) is applied to the gain control voltage application terminal 20 as a gain control voltage and a voltage $(V_9-\Delta V)$ (V) is applied to the gain control voltage application terminal 23 as the gain control voltage.

As a result, the transistors $Q_{19}$ and $Q_{22}$ of the first gain control unit 22 and the transistors $Q_{23}$ and $Q_{26}$ of the second gain control unit 25 are turned OFF, respectively, whereas the transistors $Q_{20}$ and $Q_{21}$ of the first gain control unit 22 and the transistors $Q_{24}$ and $Q_{25}$ of the second gain control unit 25 are turned ON, respectively.

Therefore, the collector direct currents $I_{C24}$ and $I_{C25}$ flow to the transistors $Q_{24}$ and $Q_{25}$ of the second gain control unit 25, respectively and the collector direct current $I_{C23}$ and $I_{C26}$ slightly flow to the transistors $Q_{23}$ and $Q_{26}$ thereof, respectively. Then, the sums of these collector direct currents $(I_{C23}+I_{C24})$ and $(I_{C25}+I_{C26})$ are supplied to the first gain control unit 22, the collector direct currents $I_{C19}$ and $I_{C22}$ slightly flow to the transistors $Q_{19}$ and $Q_{22}$ of the first gain control unit 22, respectively and the collector direct currents $I_{C20}$ and $I_{C21}$ flow to the transistors $Q_{20}$ and $Q_{21}$ thereof, respectively.

Then, the sums of these collector direct currents $(I_{C19}+I_{C20})$ and $(I_{C21}+I_{C22})$ are supplied to the transistors $Q_{17}$ and $Q_{18}$, respectively, as the collector direct currents $I_{C17}$ and $I_{C18}$.

In this case, the sum of the collector direct currents $(I_{C17}+I_{C18})$ flowing to the transistors $Q_{17}$ and $Q_{18}$, respectively has a constant value due to the existence of the constant current source 15.

As a result, the high frequency signal voltage input from the input terminal 1 is amplified through the capacitor $C_1$ by the differential operation of the transistors $Q_{17}$ and $Q_{18}$ to which collector high frequency signal currents having a negative phase to each other flow and then attenuated by the first gain control unit 22 having a gain reduce by the gain control voltage $(V_8-\Delta V)$ (V) applied to the gain control voltage application terminal 20 with its high frequency component sufficiently checked by the choke coils $L_2$ and $L_3$.

More specifically, the first gain control unit 22 operates as a base ground circuit in a high frequency, and since only the collector high frequency signal currents having a negative phase to each other slightly flow to the transistors $Q_{19}$ and $Q_{22}$, the gain of the first gain control unit 22 is reduced, whereas the collector high frequency signal currents having a negative phase to each other flow to the transistors $Q_{20}$ and $Q_{21}$. However, the high frequency component of the collector direct currents is sufficiently attenuated by the choke coils $L_2$ and $L_3$.

Next, the signal voltage slightly output from the first gain control unit 22 is further attenuated by the second gain control unit 25 having a gain reduced by the gain control voltage $(V_9-\Delta V)$ (V) applied to the gain control voltage application terminal 23 and then output from the output terminal 7 through the capacitor $C_5$. The second gain control unit 25 also operates as a base ground circuit in a high frequency in the same way as the first gain control unit 22.

As described above, the signal voltage output from the gain control circuit is kept to a predetermined level in such a manner that a voltage from $(V_8-\Delta V)$ (V) to $(V_8+\Delta V)$ (V) is applied to the gain control voltage application terminal 20 as the gain control voltage and also a voltage from $(V_9-\Delta V)$ (V) to $(V_9+\Delta V)$ (V) is applied to the gain control voltage application terminal 23 as the gain control voltage in accordance with the high frequency signal voltage output from the output terminal 7.

Further, in the above fifth example, since a common collector direct current flows to the first gain control unit 22 and second control unit 25 and the choke coils $L_2$ and $L_3$ are employed as the output stage of the first gain control unit 22, the respective collector direct currents $(I_{C23}+I_{C24})$ and $(I_{C25}+I_{C26})$ of the transistors $Q_{23}$ and $Q_{24}$ as well as the transistors $Q_{25}$ and $Q_{26}$ are gathered to thereby supply the same to the first control unit 22 and thus a power consumption can be greatly reduced as compared with prior art. Further, the distortion of a high frequency signal can be improved.

Figure 8:
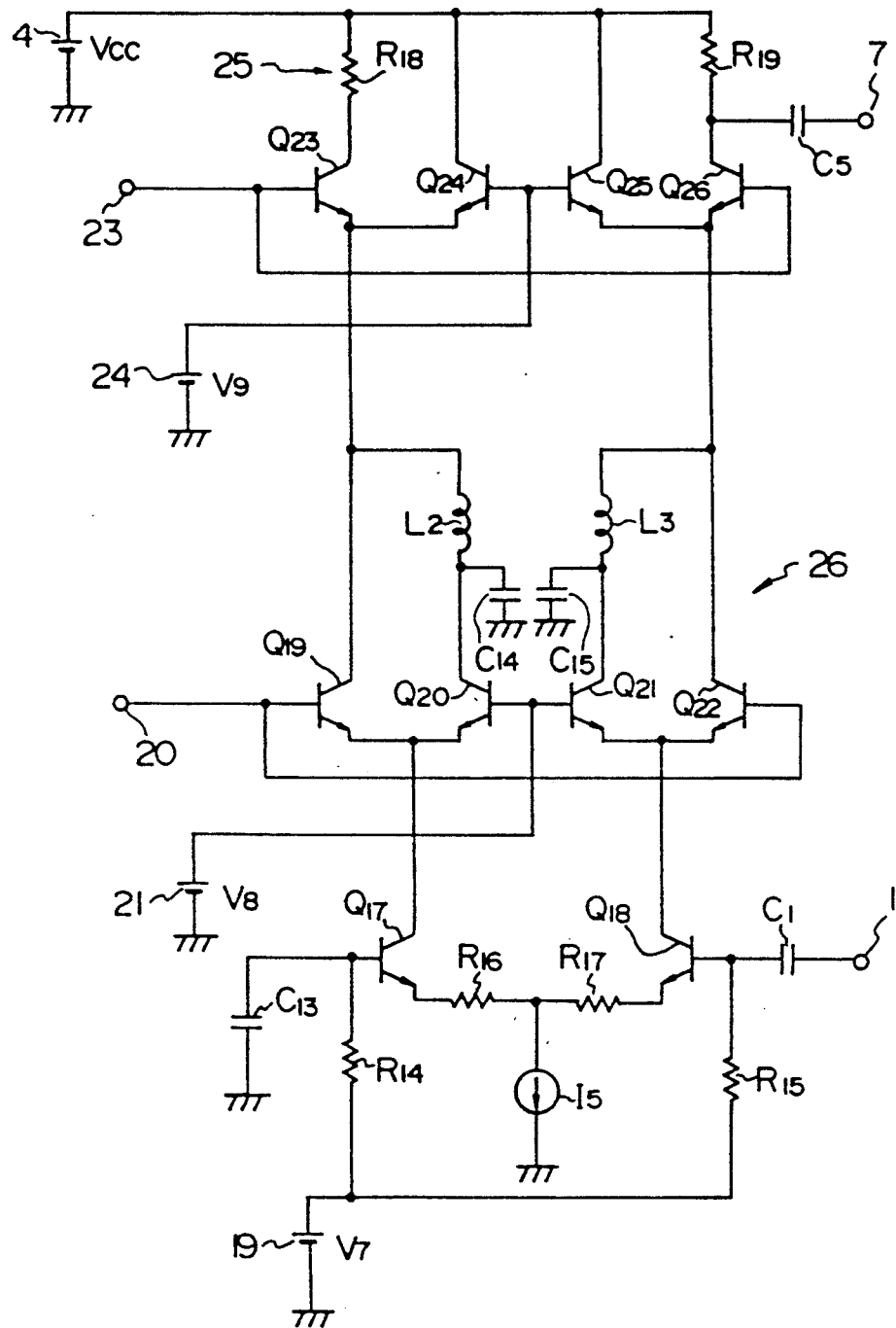
FIG. 8 is a circuit diagram showing the arrangement of the gain control circuit of a sixth embodiment according to the present invention.

Next, a sixth embodiment of the present invention will be described. FIG. 8 is a circuit diagram showing the arrangement of the gain control circuit of the sixth embodiment according to the present invention, wherein the same reference characters are used to the parts corresponding to the respective parts of FIG. 7 and the description thereof is omitted. The gain control circuit shown in FIG. 8 is provided with a first gain control unit 26 in place of the first gain control unit 22.

The first gain control unit 26 is different from the first gain control unit 22 in that a high frequency ground capacitor $C_{14}$ is interposed between the node where an end of a choke coil $L_2$ is connected to the collector of a transistor $Q_{20}$ and ground and that a high frequency ground capacitor $C_{15}$ is interposed between the node where an end of a choke coil $L_3$ is connected to the collector of a transistor $Q_{21}$ and ground.

In the above arrangement, since the operation at the time of maximum gain is substantially the same as that of the aforesaid fifth embodiment, the description thereof is omitted.

At the time of gain reduction, a voltage $(V_8-\Delta V)$ (V) is applied to a gain control voltage application terminal 20 as a gain control voltage and a voltage $(V_9-\Delta V)$ (V) is applied to a gain control voltage application terminal 23 as the gain control voltage.

As a result, the transistors $Q_{19}$ and $Q_{22}$ of the first gain control unit 26 and the transistors $Q_{23}$ and $Q_{26}$ of a second gain control unit 25 are turned OFF, respectively, whereas the transistors $Q_{20}$ and $Q_{21}$ of the first gain control unit 26 and the transistors $Q_{24}$ and $Q_{25}$ of the second gain control unit 25 are turned ON, respectively.

A high frequency signal voltage input from an input terminal 1 is amplified through a capacitor $C_1$ by the differential operation of transistors $Q_{17}$ and $Q_{18}$ to which collector high frequency signal currents having a negative phase to each other flow and then attenuated by the first gain control unit 26 having a gain reduced by the gain control voltage $(V_8-\Delta V)$ (V) applied to the gain control voltage application terminal 20 with its high frequency component more sufficiently checked by the choke coils $L_2$ and $L_3$ and capacitors $C_{14}$ and $C_{15}$.

Next, the signal voltage slightly output from the first gain control unit 26 is further attenuated by the second gain control unit 25 having a gain reduced by the gain control voltage $(V_9-\Delta V)$ (V) applied to the gain control voltage application terminal 23 and then output from an output terminal 7 through a capacitor $C_5$.

As a result, according to the aforesaid sixth embodiment, since the first gain control unit 26 is also provided with the capacitors $C_{14}$ and $C_{15}$ in addition to the choke coils $L_2$ and $L_3$ of the fifth embodiment, an amount of attenuation is greater than that of the fifth embodiment at the time of gain reduction.

Figure 9:
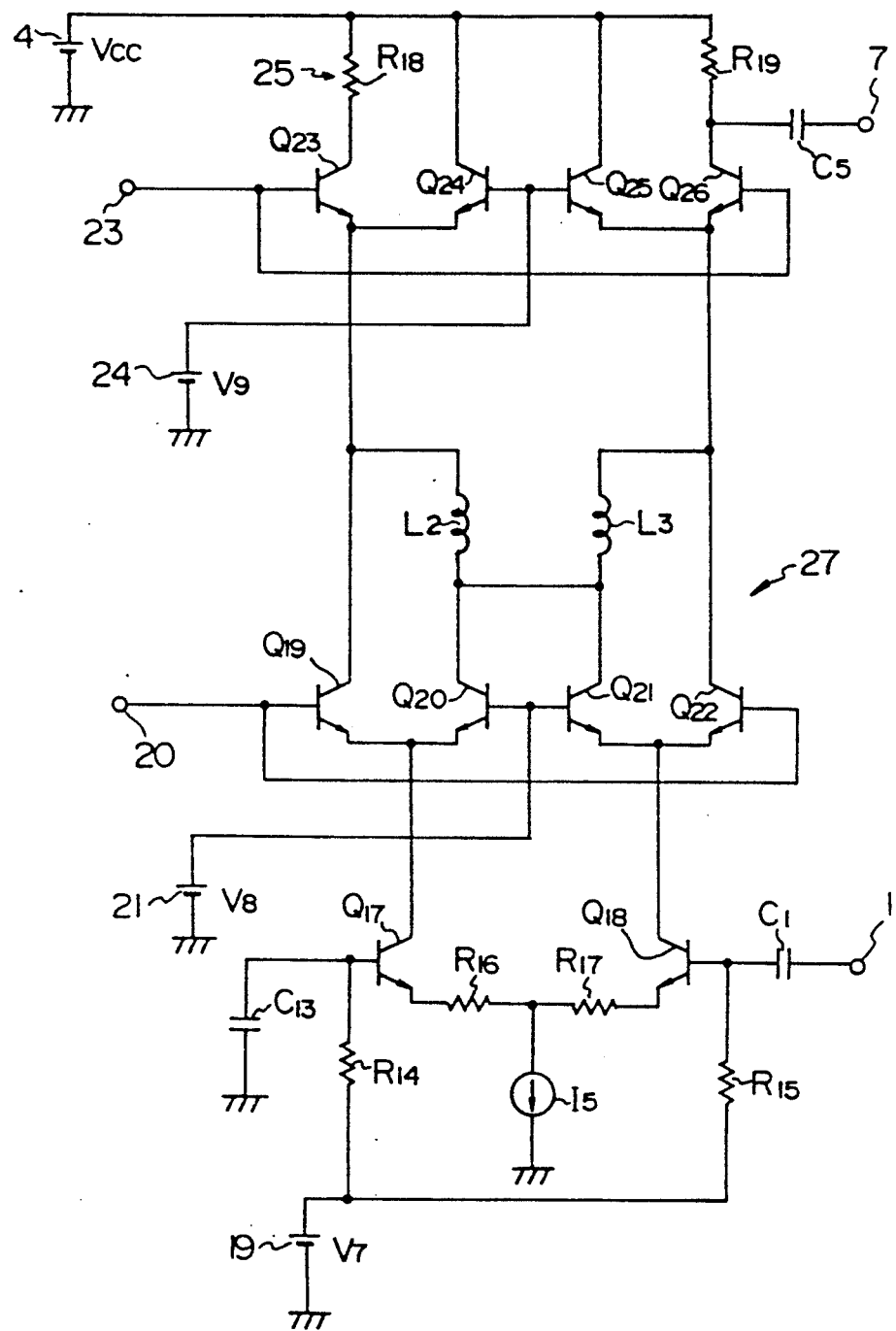
FIG. 9 is a circuit diagram showing the arrangement of the gain control circuit of a seventh embodiment according to the present invention.

Next, a seventh embodiment of the present invention will be described. FIG. 9 is a circuit diagram showing the arrangement of the gain control circuit of the seventh embodiment according to the present invention, wherein the same reference characters are used to the parts corresponding to the respective parts of FIG. 7 and the description thereof is omitted.

The gain control circuit shown in FIG. 9 is provided with a first gain control unit 27 in which the node where a choke coil $L_2$ is connected to a transistor $Q_{20}$ is connected to the node where a choke coil $L_3$ is connected to a transistor $Q_{21}$, in place of the first gain control unit 22.

In the above arrangement, since the operation at the time of maximum gain is substantially the same as that of the aforesaid fifth embodiment, the description thereof is omitted.

At the time of gain reduction, a voltage $(V_8-\Delta V)$ (V) is applied to a gain control voltage application terminal 20 as a gain control voltage and a voltage $(V_9-\Delta V)$ (V) is applied to a gain control voltage application terminal 23 as the gain control voltage.

As a result, the transistors $Q_{19}$ and $Q_{22}$ of the first gain control unit 27 and the transistors $Q_{23}$ and $Q_{26}$ of a second gain control unit 25 are turned OFF, respectively and the transistors $Q_{20}$ and $Q_{21}$ of the first gain control unit 27 and the transistors $Q_{24}$ and $Q_{25}$ of the second gain control unit 25 are turned ON, respectively.

A high frequency signal voltage input from an input terminal 1 is amplified through a capacitor $C_1$ by the differential operation of transistors $Q_{17}$ and $Q_{18}$ to which collector high frequency signal currents having a negative phase to each other flow and then attenuated by the first gain control unit 27 having a gain reduced by the gain control voltage $(V_8-\Delta V)$ (V) applied to the gain control voltage application terminal 20 with its high frequency component sufficiently checked by the choke coils $L_2$ and $L_3$.

In this case, as described with reference to the fifth embodiment, since collector high frequency signal currents having a negative phase to each other flow to the transistors $Q_{20}$ and $Q_{21}$, the high frequency signal voltages produced at the respective collectors thereof have a negative phase to each other. Therefore, when the collector of the transistor $Q_{20}$ is connected to the collector of the transistor $Q_{21}$ as in this embodiment, the node of these collectors serves as an intermediate point in terms of high frequency, that is, the node is in the state as if it was grounded in terms of high frequency and thus the high frequency signal voltages produced at these collectors are canceled and sufficiently attenuated.

Next, the signal voltage slightly output from the first gain control unit 27 is further attenuated by the second gain control unit 25 having a gain reduced by the gain control voltage $(V_9 - \Delta V)$ (V) applied to the gain control voltage application terminal 23 and then output from an output terminal 7 through a capacitor $C_5$.

As a result, according to the aforesaid seventh embodiment, since the first gain control unit 27 is arranged such that the node where the choke coil $L_2$ of the fifth embodiment is connected to the transistor $Q_{20}$ thereof is connected to the node where the choke coil $L_3$ is connected to the transistor $Q_{21}$, an amount of reduction is greater than that of the fifth embodiment at the time of gain reduction.

Figure 10:
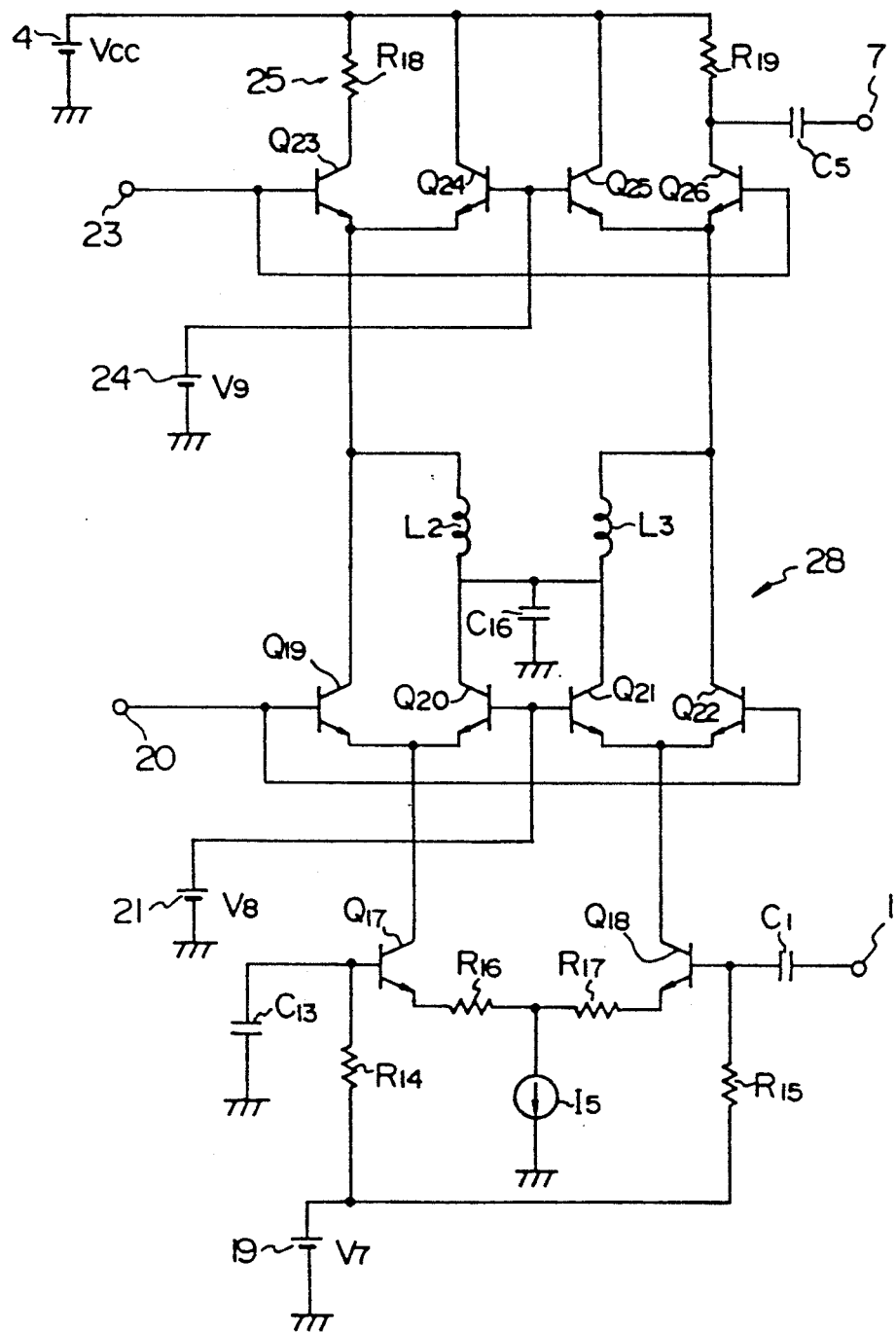
FIG. 10 is a circuit diagram showing the arrangement of the gain control circuit of an eighth embodiment according to the present invention.

Next, an eighth embodiment of the present invention will be described. FIG. 10 is a circuit diagram showing the arrangement of the gain control circuit of the eighth embodiment according to the present invention, wherein the same reference characters are used to the parts corresponding to the respective parts of FIG. 9 and the description thereof is omitted. The gain control circuit shown in FIG. 10 is provided with a first gain control unit 28 in place of the first gain control unit 27 and the gain control unit 28 has a high frequency ground capacitor $C_{16}$ interposed between the node where an end of a choke coil $L_2$ is connected to an end of a choke coil $L_3$ and ground.

Since the operation at the time of maximum gain of the eighth embodiment arranged as described above is substantially the same as that of the aforesaid fifth embodiment, the description thereof is omitted.

At the time of gain reduction, a voltage $(V_8 - \Delta V)$ (V) is applied to a gain control voltage application terminal 20 as a gain control voltage and a voltage $(V_9 - \Delta V)$ (V) is applied to a gain control voltage application terminal 23 as the gain control voltage.

As a result, the transistors $Q_{19}$ and $Q_{22}$ of the first gain control unit 28 and the transistors $Q_{23}$ and $Q_{26}$ of a second gain control unit 25 are turned OFF, respectively, whereas the transistors $Q_{20}$ and $Q_{21}$ of the first gain control unit 28 and the transistors $Q_{24}$ and $Q_{25}$ of the second gain control unit 25 are turned ON, respectively.

A high frequency signal voltage input from an input terminal 1 is amplified through a capacitor $C_1$ by the differential operation of transistors $Q_{17}$ and $Q_{18}$ to which collector high frequency signal currents having a negative phase to each other flow and then attenuated by the first gain control unit 28 having a gain reduced by the gain control voltage $(V_8 - \Delta V)$ (V) applied to the gain control voltage application terminal 20 with its high frequency component sufficiently checked by the choke coils $L_2$ and $L_3$ and capacitor $C_{16}$.

In this case, as described with reference to the fifth embodiment, since collector high frequency signal currents having a negative phase to each other flow to the transistors $Q_{20}$ and $Q_{21}$, the high frequency signal voltages produced at the respective collectors thereof have a negative phase to each other. Therefore, when the collector of the transistor $Q_{20}$ is connected to the collector of the transistor $Q_{21}$ as in this embodiment, the node of these collectors serves as an intermediate point in terms of high frequency, that is, the node is in the state as if it was grounded in terms of high frequency and thus the high frequency signal voltages produced at these collectors are canceled and sufficiently attenuated.

Further, even if the node where the collector of the transistor $Q_{20}$ is connected to the collector of the transistor $Q_{21}$ does not serve as the intermediate point in terms of high frequency, that is, even if unbalanced collector high frequency signal currents having a negative phase to each other flows to the transistors $Q_{20}$ and $Q_{21}$, the high frequency signal voltages produced at the collectors of the transistors $Q_{20}$ and $Q_{21}$ are sufficiently attenuated due to the existence of the high frequency check capacitor $C_{16}$.

Next, the signal voltage slightly output from the first gain control unit 28 is further attenuated by the second gain control unit 25 having a gain reduced by the gain control voltage $(V_9 - \Delta V)$ (V) applied to the gain control voltage application terminal 23 and then output from an output terminal 7 through a capacitor $C_5$.

Figure 11:
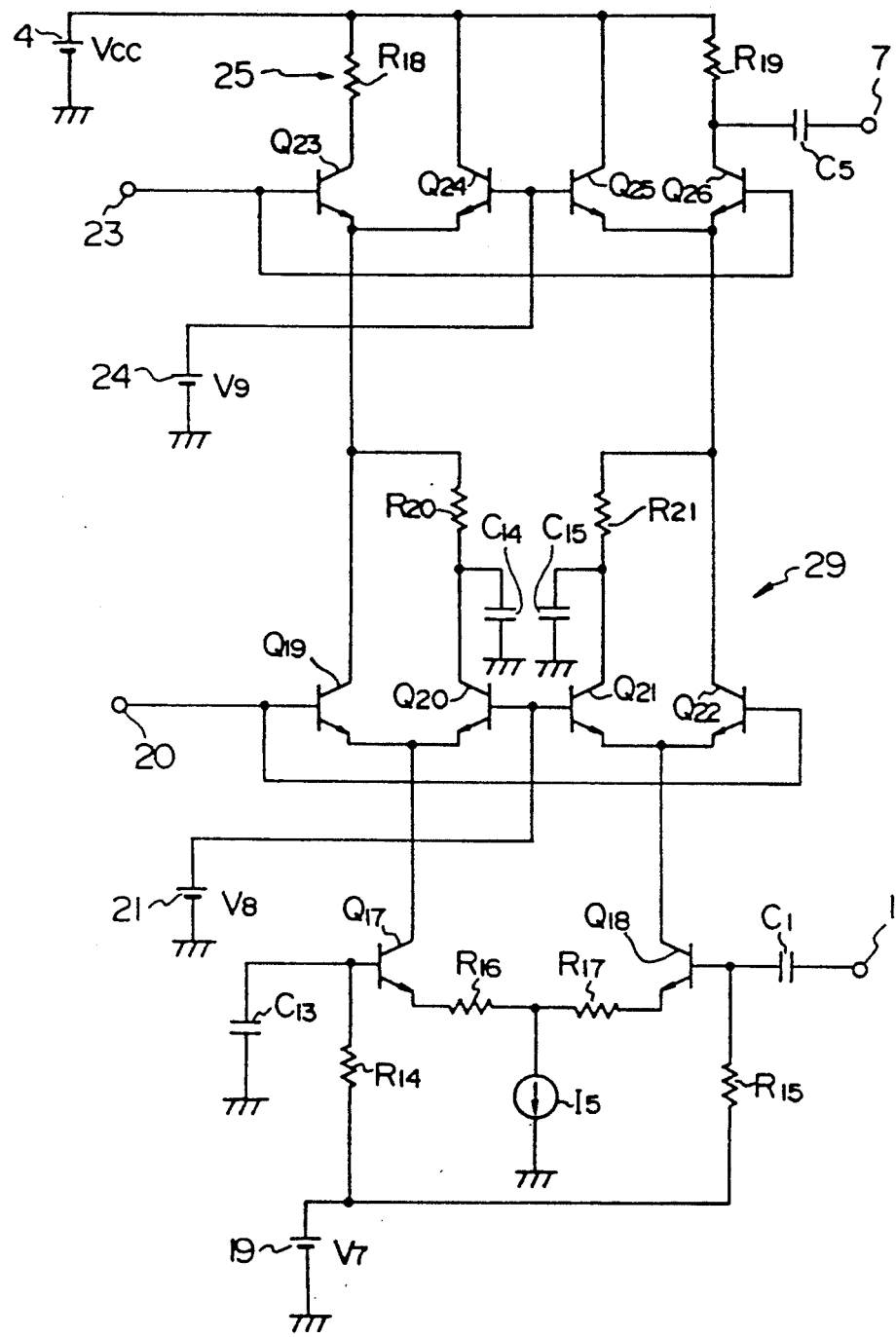
FIG. 11 is a circuit diagram showing the arrangement of the gain control circuit of a ninth embodiment according to the present invention.

Next, a ninth embodiment of the present invention will be described. FIG. 11 is a circuit diagram showing the arrangement of the gain control circuit of the ninth embodiment according to the present invention, wherein the same reference characters are used to the parts corresponding to the respective parts of FIG. 8 and the description thereof is omitted. The gain control circuit shown in FIG. 11 is provided with a first gain control unit 29 in place of the first gain control unit 26 and the gain control unit 29 has a high frequency check resistors $R_{21}$ and $R_{22}$ in place of the choke coils $L_2$ and $L_3$.

Note, since the operation of the ninth embodiment is substantially the same as that of the aforesaid sixth embodiment, the description thereof is omitted.

Figure 12:
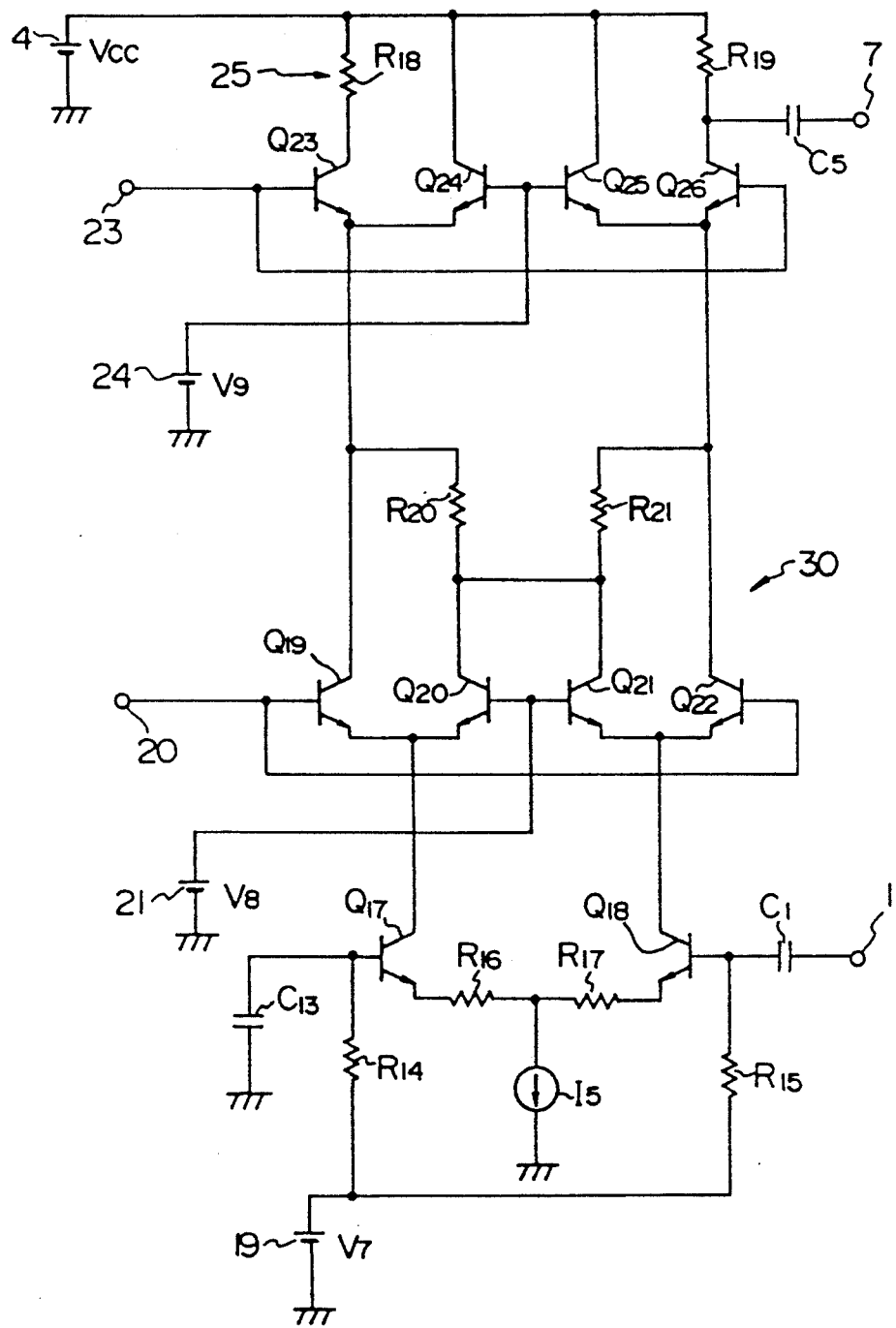
FIG. 12 is a circuit diagram showing the arrangement of the gain control circuit of a tenth embodiment according to the present invention.

Next, a tenth embodiment of the present invention will be described. FIG. 12 is a circuit diagram showing the arrangement of the gain control circuit of the tenth embodiment according to the present invention, wherein the same reference characters are used to the parts corresponding to the respective parts of FIG. 9 and the description thereof is omitted. The gain control circuit shown in FIG. 12 is provided with a first gain control unit 30 in place of the first gain control unit 27 and the gain control unit 30 is provided with a high frequency check resistors $R_{21}$ and $R_{22}$ in place of the choke coils $L_2$ and $L_3$.

Note, since the operation of the tenth embodiment is substantially the same as that of the aforesaid seventh embodiment, the description thereof is omitted.

Figure 13:
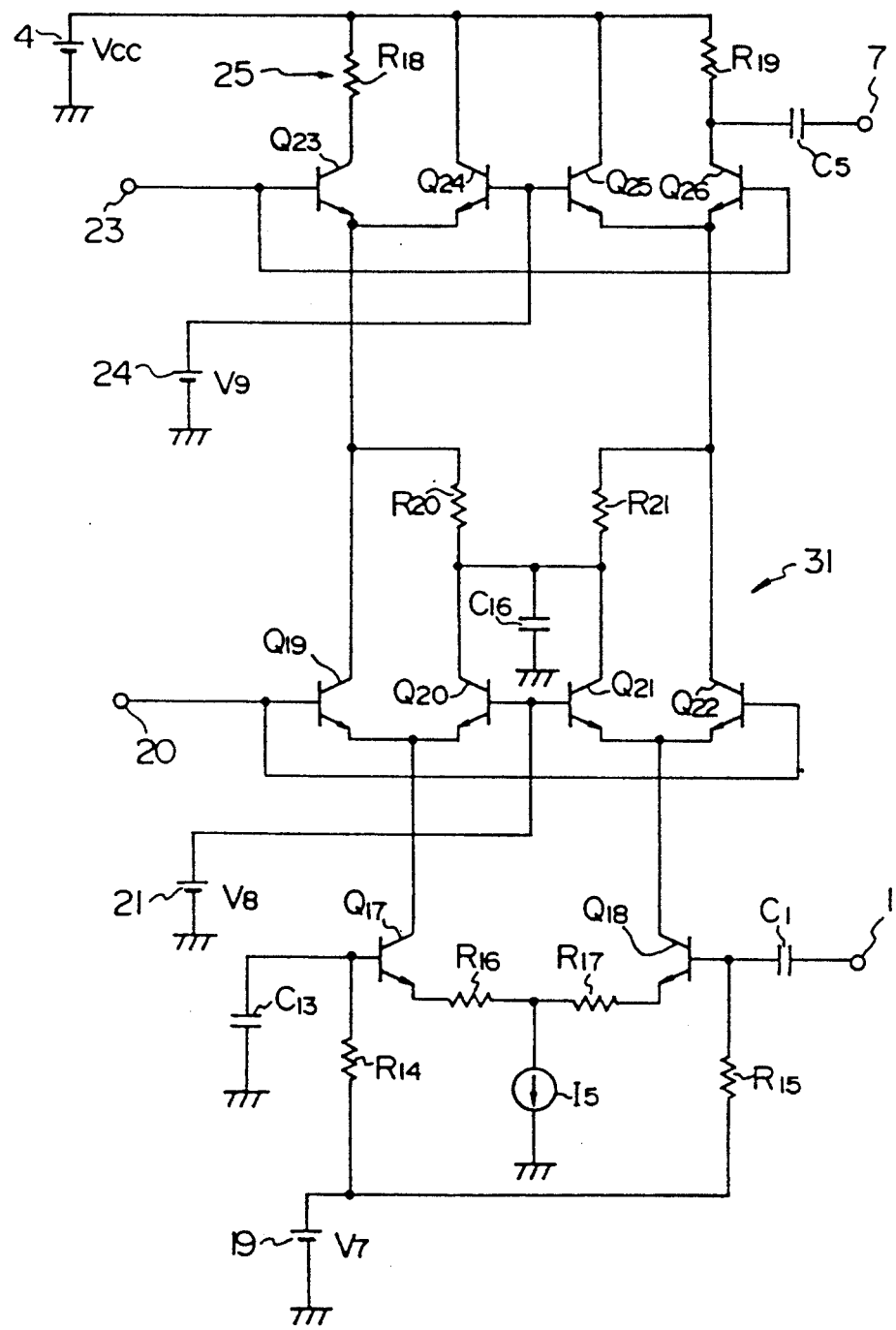
FIG. 13 is a circuit diagram showing the arrangement of the gain control circuit of an eleventh embodiment according to the present invention.

Next, an eleventh embodiment of the present invention will be described. FIG. 13 is a circuit diagram showing the arrangement of the gain control circuit of the eleventh embodiment according to the present invention, wherein the same reference characters are used to the parts corresponding to the respective parts of FIG. 10 and the description thereof is omitted. The gain control circuit shown in FIG. 13 is provided with a first gain control unit 31 in place of the first gain control unit 28 and the gain control unit 31 has a high frequency check resistors $R_{21}$ and $R_{22}$ in place of the choke coils $L_2$ and $L_3$.

Note, since the operation of the eleventh embodiment is substantially the same as that of the aforesaid eighth embodiment, the description thereof is omitted.

Figure 14:
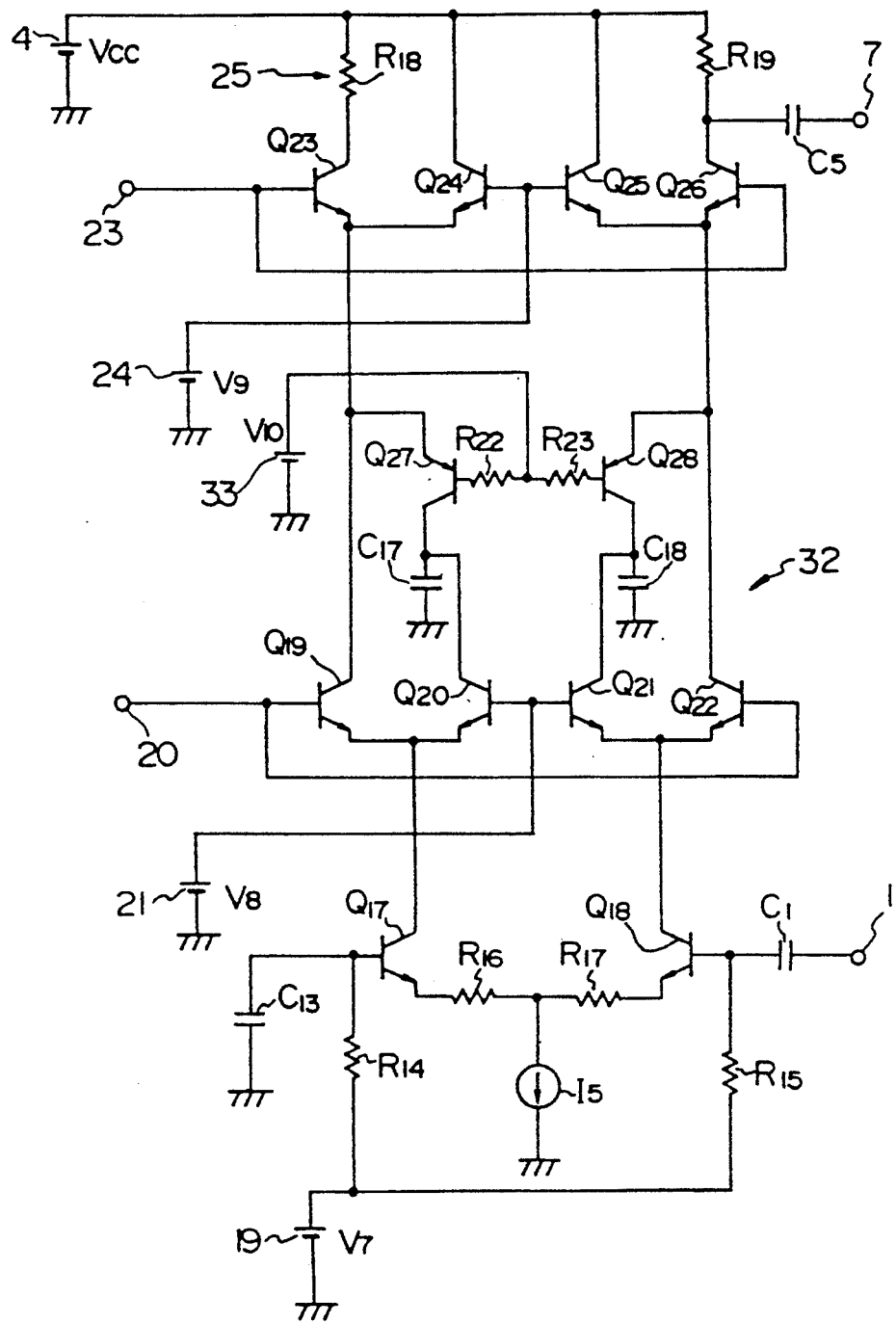
FIG. 14 is a circuit diagram showing the arrangement of the gain control circuit of a twelfth embodiment according to the present invention.

Next, a twelfth embodiment of the present invention will be described. FIG. 14 is a circuit diagram showing the arrangement of the gain control circuit of the twelfth embodiment according to the present invention, wherein the same reference characters are used to the parts corresponding to the respective parts of FIG. 7 and the description thereof is omitted. The gain control circuit shown in FIG. 14 is provided with a first gain control unit 32 in place of the first gain control unit 22.

In the first gain control unit 32, reference characters $Q_{27}$ and $Q_{28}$ designate high frequency check PNP transistors with similar characteristics, respectively; reference character 33 designates a constant voltage source for applying a bias voltage $V_{10}$; reference characters $R_{22}$ and $R_{23}$ designate resistors for applying the bias voltage; and reference characters $C_{17}$ and $C_{18}$ designate high frequency ground capacitors, respectively.

In this arrangement, first, at the time of maximum gain, a voltage $(V_8+\Delta V)$ (V) is applied to a gain control voltage application terminal 20 as a gain control voltage and a voltage $(V_9+\Delta V)$ (V) is applied to a gain control voltage application terminal 23 as the gain control voltage.

As a result, the transistors $Q_{19}$ and $Q_{22}$ of the first gain control unit 32 and the transistors $Q_{23}$ and $Q_{26}$ of a second gain control unit 25 are turned ON, respectively, whereas the transistors $Q_{20}$, $Q_{21}$, $Q_{27}$ and $Q_{28}$ of the first gain control unit 32 and the transistors $Q_{24}$ and $Q_{25}$ of the second gain control unit 25 are turned OFF, respectively.

Therefore, collector direct currents $I_{C23}$ and $I_{C26}$ flow to the transistors $Q_{23}$ and $Q_{26}$ of the second gain control unit 25, respectively, and collector direct currents $I_{C24}$ and $I_{C25}$ slightly flow to the transistor $Q_{24}$ and $Q_{25}$, respectively. Then, the sums of these collector direct currents $(I_{C23}+I_{C24})$ and $(I_{C25}+I_{C26})$ are supplied to the first gain control unit 32.

Next, although collector direct currents $I_{C19}$ and $I_{C22}$ flow to the transistors $Q_{19}$ and $Q_{22}$ of the first gain control unit 32, respectively, collector direct currents $I_{C20}$ and $I_{C21}$ only slightly flow to the transistors $Q_{20}$ and $Q_{21}$, respectively, and the slight amounts of the collector direct currents $I_{C20}$ and $I_{C21}$ flow to the transistors $Q_{27}$ and $Q_{28}$ as collector direct currents $I_{C27}$ and $I_{C28}$, respectively.

Then, the sums of these collector direct currents $(I_{C19}+I_{C20})$ and $(I_{C21}+I_{C22})$ are supplied to the transistors $Q_{17}$ and $Q_{18}$, respectively as collector direct currents $I_{C17}$ and $I_{C18}$.

In this case, the sum of the collector direct currents $(I_{C17}+I_{C18})$ flowing to the transistor $Q_{17}$ and $Q_{18}$, respectively has a constant value due to the existence of a constant current source $I_5$.

As a result, a high frequency signal voltage input from an input terminal 1 is amplified through a capacitor $C_1$ by the differential operation of transistors $Q_{17}$ and $Q_{18}$ to which collector high frequency signal currents having a negative phase to each other flow and then amplified by the first gain control unit 32 having a gain controlled to a maximum value by the gain control voltage $(V_8+\Delta V)$ (V) applied to the gain control voltage application terminal 20.

In this case, since the base of the transistor $Q_{19}$ is connected to the base of the transistor $Q_{22}$ and the base of the transistor $Q_{20}$ is connected to the base of the transistor $Q_{21}$, collector high frequency currents having a negative phase to each other flow to the transistors $Q_{19}$ and $Q_{22}$ and a base current flowing to the node of these bases has a constant value, and in the same way collector high frequency signal currents having a negative phase to each other slightly flow to the transistors $Q_{20}$ and $Q_{21}$ and a base current flowing to the node of these bases has a constant value.

Therefore, since the base current of each of the transistors $Q_{19}$–$Q_{22}$ has a constant value regardless of the impedance of a base bias supply unit, the respective base nodes serve as an intermediate point in terms of high frequency, that is, they are as if grounded in terms of high frequency and thus the first gain control unit 32 operates as a base ground circuit in high frequency.

Note, as described above, since the transistors $Q_{20}$ and $Q_{27}$ and the transistors $Q_{21}$ and $Q_{28}$ are turned OFF, respectively, an input impedance to the high frequency signals of the emitters of the transistors Q27 and Q28 is higher than that of the second gain control unit 25, and thus the maximum gain of the first gain unit 32 is not deteriorated as compared with that of the aforesaid fifth embodiment.

Next, the signal voltage output from the first gain control unit 32 is amplified by the second gain control unit 25 having a gain controlled to a maximum value by the gain control voltage $(V_9+\Delta V)$ (V) applied to the gain control voltage application terminal 23 and then output from an output terminal 7 through a capacitor $C_5$. The second gain control unit 25 also operates as a base ground circuit in high frequency in the same way as the first gain control unit 32.

On the other hand, at the time of gain reduction, a voltage $(V_8-\neq V)$ (V) is applied to the gain control voltage application terminal 20 as a gain control voltage and a voltage $(V_9-\Delta V)$ (V) is applied to the gain control voltage application terminal 23 as the gain control voltage.

As a result, the transistors $Q_{19}$ and $Q_{22}$ of the first gain control unit 32 and the transistors $Q_{23}$ and $Q_{26}$ of the second gain control unit 25 are turned OFF, respectively, whereas the transistors $Q_{20}$, $Q_{21}$, $Q_{27}$ and $Q_{28}$ of the first gain control unit 32 and the transistors $Q_{24}$ and $Q_{25}$ of the second gain control unit 25 are turned ON, respectively.

Therefore, the collector direct currents $I_{C24}$ and $I_{C25}$ flow to the transistors $Q_{24}$ and $Q_{25}$ of the second gain control unit 25, respectively and the collector direct currents $I_{C23}$ and $I_{C26}$ slightly flow to the transistors $Q_{23}$ and $Q_{26}$; thereof, respectively. Then, the sums of these collector direct currents $(I_{C23}+I_{C24})$ and $(I_{C25}+I_{C26})$ are supplied to the first gain control unit 32.

Next, the collector direct currents $I_{C27}$ and $I_{C28}$ flow to the transistors $Q_{27}$ and $Q_{28}$ of the first gain control unit 32, respectively, and these collector direct currents $I_{C27}$ and $I_{C28}$ flow to the transistors $Q_{20}$ and $Q_{21}$ as the collector direct currents $I_{C20}$ and $I_{C21}$.

Then, the sums of these collector direct currents $(I_{C19}+I_{C20})$ and $(I_{C21}+I_{C22})$ are supplied to the transistors $Q_{17}$ and $Q_{18}$ as the collector direct currents $I_{C17}$ and $I_{C18}$, respectively.

In this case, the sum of the collector direct currents $(I_{C17}+I_{C18})$ flowing to the transistors $Q_{17}$ and $Q_{18}$, respectively has a constant value due to the existence of the constant current source $I_5$.

As a result, the high frequency signal voltage input from the input terminal 1 is amplified through the capacitor $C_1$ by the differential operation of the transistors $Q_{17}$ and $Q_{18}$ to which collector high frequency signal currents having a negative phase to each other flow and then attenuated by the first gain control unit 32 having a gain reduced by the gain control voltage $(V_8-\Delta V)$ (V) applied to the gain control voltage application terminal 20.

More specifically, the first gain control unit 32 operates as a base ground circuit in high frequency, and since collector high frequency signal currents having a negative phase to each other slightly flow to the transistors $Q_{19}$ and $Q_{22}$, the gain of the first gain control unit 22 is reduced, whereas collector high frequency signal currents having a negative phase to each other flow to the transistors $Q_{20}$ and $Q_{21}$. However, the high frequency signal voltages produced at the collectors of the transistors $Q_{20}$ and $Q_{21}$ are sufficiently attenuated by the reverse direction transmission characteristics of the capacitors $C_{17}$ and $C_{18}$ and the high frequency check PNP transistors $Q_{27}$ and $Q_{28}$ having collectors connected to the signal input side.

Next, the signal voltage slightly output from the first gain control unit 32 is further attenuated by the second gain control unit 25 having a gain reduced by the gain control voltage $(V_9-\Delta V)$ (V) applied to the gain control voltage application terminal 23 and then output from the output terminal 7 through the capacitor $C_5$. The second gain control unit 25 also operates as a base ground circuit in high frequency in the same way as the first gain control unit 32.

As described above, according to the aforesaid twelfth embodiment, since the transistors $Q_{27}$ and $Q_{28}$, high frequency ground capacitors $C_{17}$ and $C_{18}$, resistors $R_{23}$ and $R_{24}$ and constant voltage source 33 are provided in place of the choke coils $L_2$ and $L_3$ of the fifth embodiment, a maximum gain at the time of the maximum gain is greater than that of the fifth embodiment.

Figure 15:
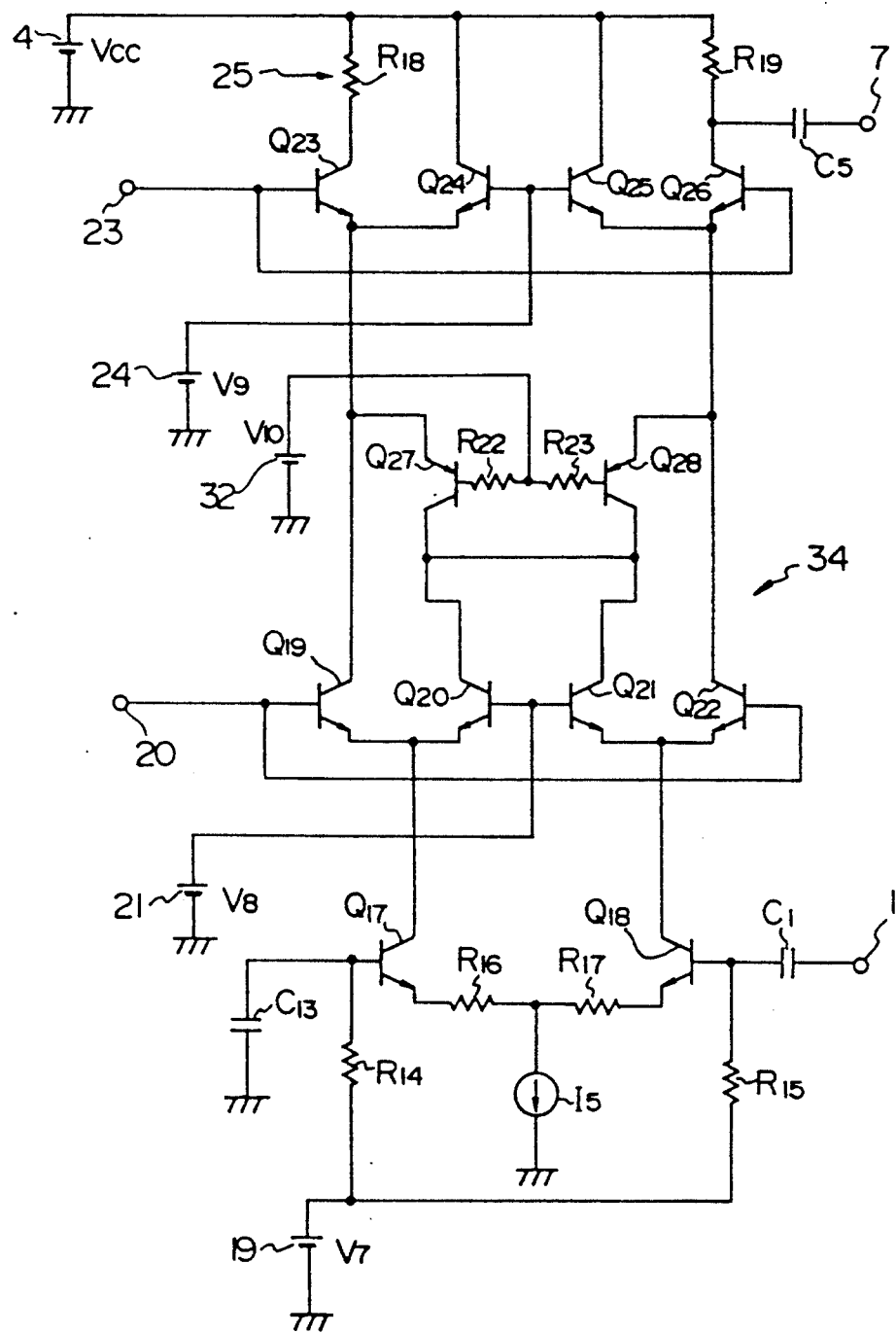
FIG. 15 is a circuit diagram showing the arrangement of the gain control circuit of a thirteenth embodiment according to the present invention.

Next, a thirteen embodiment of the present invention will be described. FIG. 15 is a circuit diagram showing the arrangement of the gain control circuit of the thirteen embodiment according to the present invention, wherein the same reference characters are used to the parts corresponding to the respective parts of FIG. 14 and the description thereof is omitted. The gain control circuit shown in FIG. 15 is provided with a first gain control unit 34 in which the node where the collector of a transistor $Q_{27}$ is connected to the collector of a transistor $Q_{20}$ is connected to the node where the collector of a transistor $Q_{28}$ is connected to the collector of a transistor $Q_{21}$ in place of the first gain control unit 32.

In the above arrangement, since the operation at the time of maximum gain is substantially the same as that of the aforesaid twelfth embodiment, the description thereof is omitted.

At the time of gain reduction, a voltage $(V_8-\Delta V)$ (V) is applied to a gain control voltage application terminal 20 as a gain control voltage and a voltage $(V_9-\Delta V)$ (V) is applied to a gain control voltage application terminal 23 as the gain control voltage.

As a result, the transistors $Q_{19}$ and $Q_{22}$ of the first gain control unit 32 and the transistors $Q_{23}$ and $Q_{26}$ of a second gain control unit 25 are turned OFF, respectively, whereas the transistors $Q_{20}$, $Q_{21}$, $Q_{27}$ and $Q_{28}$ of the first gain control unit 34 and the transistors $Q_{24}$ and $Q_{25}$ of the second gain control unit 25 are turned ON, respectively.

A high frequency signal voltage input from an input terminal 1 is amplified through a capacitor $C_1$ by the differential operation of transistors $Q_{17}$ and $Q_{18}$ to which collector high frequency signal currents having a negative phase to each other flow and then attenuated by the first gain control unit 34 having a gain reduced by the gain control voltage $(V_8-\Delta V)$ (V) applied to the gain control voltage application terminal 20 as well as sufficiently attenuated by the reverse direction transmission In this case, as described with reference to the fifth embodiment, since collector high frequency signal currents having a negative phase to each other flow to the transistors $Q_{20}$ and $Q_{21}$, the high frequency signal voltages produced at the respective collectors thereof have a negative phase to each other. Therefore, when the collector of the transistor $Q_{20}$ is connected to the collector of the transistor $Q_{21}$ as in this embodiment, the node of these collectors serves as an intermediate point in terms of high frequency, that is, the node is in the state as if it was grounded in terms of high frequency and thus the high frequency signal voltages produced at these collectors are canceled and sufficiently attenuated.

Next, the signal voltage slightly output from the first gain control unit 34 is further attenuated by the second gain control unit 25 having a gain reduced by the gain control voltage $(V_9-\Delta V)$ (V) applied to a gain control voltage application terminal 23 and then output from an output terminal 7 through a capacitor $C_5$.

Figure 16:
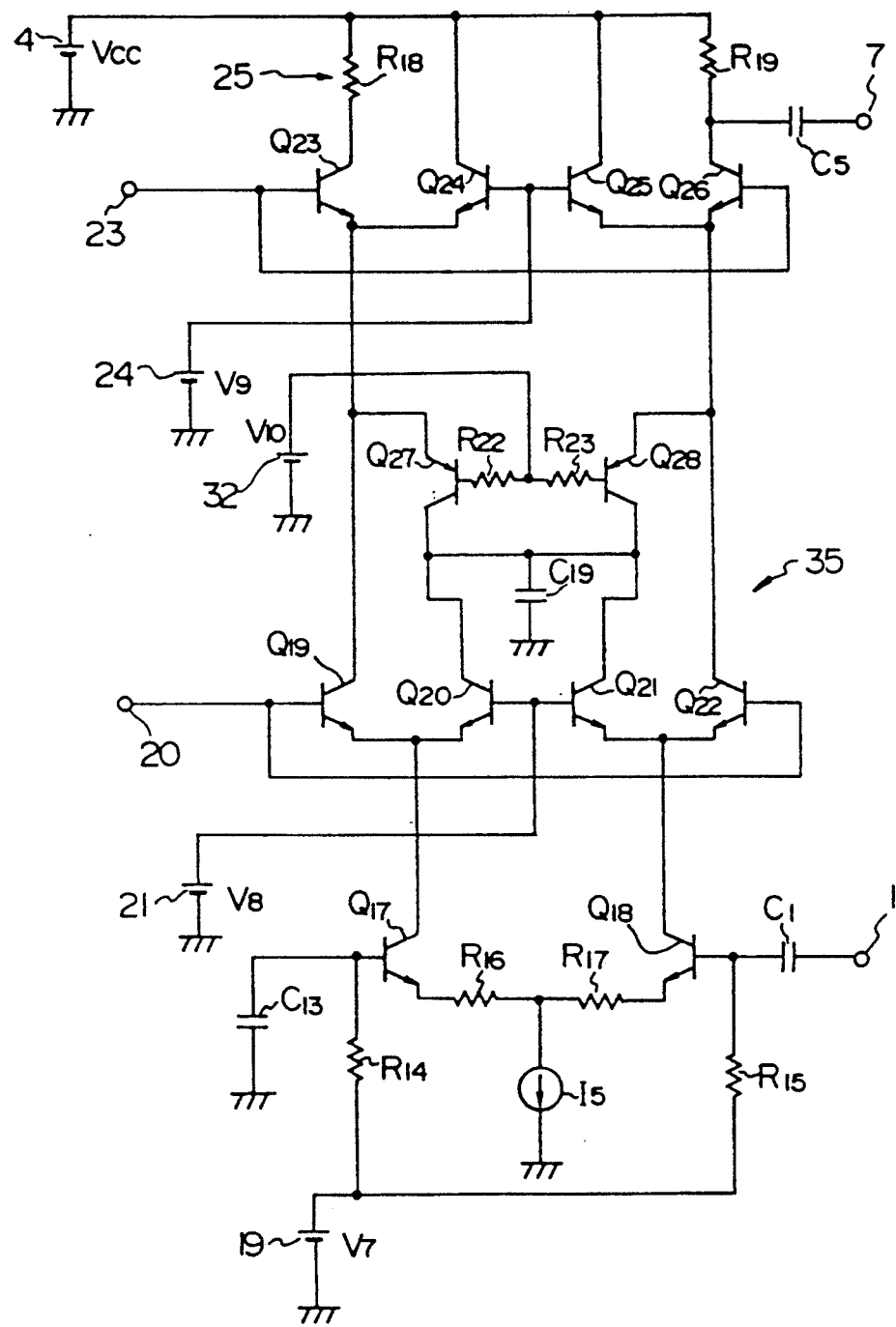
FIG. 16 is a circuit diagram showing the arrangement of the gain control circuit of a fourteenth embodiment according to the present invention.

Next, a fourteen embodiment of the present invention will be described. FIG. 16 is a circuit diagram showing the arrangement of the gain control circuit of the fourteen embodiment according to the present invention, wherein the same reference characters are used to the parts corresponding to the respective parts of FIG. 15 and the description thereof is omitted. The gain control circuit shown in FIG. 16 is provided with a first gain control unit 35 in place of the first gain control unit 34 and the gain control unit 35 has a high frequency ground capacitor $C_{19}$ interposed between the node where the collector of a transistor $Q_{20}$ is connected to the collector of a transistor $Q_{21}$ and ground.

Since the operation at the time of maximum gain of this embodiment arranged as described above is substantially the same as that of the aforesaid thirteen embodiment, the description thereof is omitted.

At the time of gain reduction, a voltage $(V_8-\Delta V)$ (V) is applied to a gain control voltage application terminal 20 as a gain control voltage and a voltage $(V_9-\Delta V)$ (V) is applied to a gain control voltage application terminal 23 as the gain control voltage.

As a result, the transistors $Q_{19}$ and $Q_{22}$ of the first gain control unit 35 and the transistors $Q_{23}$ and $Q_{26}$ of a second gain control unit 25 are turned OFF, respectively, whereas the transistors $Q_{20}$, $Q_{21}$, $Q_{27}$ and $Q_{28}$ of the first gain control unit 35 and the transistors $Q_{24}$ and $Q_{25}$ of the second gain control unit 25 are turned ON, respectively.

A high frequency signal voltage input from an input terminal 1 is amplified through a capacitor $C_1$ by the differential operation of transistors $Q_{17}$ and $Q_{18}$ to which collector high frequency signal currents having a negative phase to each other flow and then attenuated by the first gain control unit 35 having a gain reduced by the gain control voltage $(V_8-\Delta V)$ (V) applied to the gain control voltage application terminal 20 as well as sufficiently attenuated by the reverse direction transmission characteristics of the capacitor $C_{19}$ and transistors $Q_{27}$ and $Q_{28}$.

In this case, as described with reference to the fifth embodiment, since collector high frequency signal currents having a negative phase to each other flow to the transistors $Q_{20}$ and $Q_{21}$, the high frequency signal voltages produced at the respective collectors thereof have a negative phase to each other. Therefore, when the collector of the transistor $Q_{20}$ is connected to the collector of the transistor $Q_{21}$ as in this embodiment, the node of these collectors serves as an intermediate point in terms of high frequency, that is, the node is in the state as if it was grounded in terms of high frequency and thus the high frequency signal voltages produced at these collectors are canceled and sufficiently attenuated.

Further, even if the node where the collector of the transistor $Q_{20}$ is connected to the collector of the transistor $Q_{21}$ does not serve as the intermediate point in terms of high frequency, that is, even if unbalanced collector high frequency signal currents having a negative phase to each other flows to the transistors $Q_{20}$ and $Q_{21}$, the high frequency signal voltages produced at the collectors of the transistors $Q_{20}$ and $Q_{21}$ are sufficiently attenuated due to the existence of the high frequency check capacitor $C_{19}$.

Next, the signal voltage slightly output from the first gain control unit 35 is further attenuated by the second gain control unit 25 having a gain reduced by the gain control voltage $(V_9 - \Delta V)$ (V) applied to the gain control voltage application terminal 23 and then output from an output terminal 7 through a capacitor $C_5$.

Note, although the aforesaid respective embodiments show examples using bipolar transistors as an active element, the same operation and effect as those of the aforesaid embodiments can be obtained even if field effect transistors (FETs) are used in place of the bipolar transistors.

As described above, according to the present invention, an effect can be obtained in that a power consumption can be reduced as well as the distortion of an output signal can be improved.

What is claimed is:

1. A gain control circuit, comprising:
   a current dividing type gain control unit including, first and second transistors having emitters connected to each other;
   a high frequency check means having one end connected to the collector of said first transistor and the other end connected to the collector of said second transistor for checking a high frequency signal current;
   an input terminal composed of the node where said emitters are connected to each other for causing an emitter direct current to be conducted therethrough and a signal current also to be input thereto;
   an output terminal composed of the node where the collector of one of said first and second transistors is connected to said high frequency check means for causing a collector direct current to be conducted therethrough and a signal current also to be output therefrom; and
   a means for changing the dividing ratio of the collector direct current to said first and second transistors, whereby gain is controlled by said dividing ratio; and
   a rear stage circuit unit including at least one transistor having an emitter connected to the output terminal of said gain control unit and a collector serving as an output terminal.

2. A gain control circuit according to claim 1, wherein a choke coil is used as said high frequency check means.

3. A gain control circuit according to claim 1, wherein a resistor is used as said high frequency check means.

4. A gain control circuit according to claim 1, wherein transistors are used as said high frequency check means.

5. A gain control circuit, comprising:
   a current dividing type gain control unit including, first and second transistors having emitters connected to each other;
   a high frequency check means having one end connected to the collector of said first transistor and the other end connected to the collector of said second transistor for checking a high frequency signal current;
   an input terminal composed of the node where said emitters are connected to each other for causing an emitter direct current to be conducted therethrough and a signal current also to be input thereto;
   an output terminal composed of the node where the collector of one of said first and second transistors is connected to said high frequency check means for causing a collector direct current to be conducted therethrough and a signal current also to be output therefrom; and
   a means for changing the dividing ratio of the collector direct current to said first and second transistors, whereby gain is controlled by said dividing ratio; and
   a second current dividing type gain control unit composed of third and fourth transistors having emitters connected to the output terminal of said current dividing type gain control unit and the node where said emitters are connected to each other serves as an input terminal for causing an emitter direct current to be conducted therethrough and a signal current also to be input thereto.

6. A gain control circuit according to claim 5, wherein a choke coil is used as said high frequency check means.

7. A gain control circuit according to claim 5, wherein a resistor is used as said high frequency check means.

8. A gain control circuit according to claim 5, wherein transistors are used as said high frequency check means.

9. A gain control circuit device, comprising: a first gain control circuit including:
   first and second transistors having emitters connected to each other and to an input terminal, collectors connected to a first output terminal, and bases connected to receive first and second gain control voltage signals, respectively, and
   a high frequency blocking element connected between the collector of one of the first and second transistors and the output terminal; and a second gain control circuit including:

third and fourth transistors having emitters connected to each other and to the first output terminal, collectors connected to a power supply, and bases connected to receive third and fourth gain control voltage signals, respectively, a load resistor connected between the collector of one of the third and fourth transistors and the power supply, and a second output terminal located between the resistor and the collector of said one of said third and fourth transistors;

wherein a gain of an output signal on the second output terminal is altered by varying one or more of the first, second, third and fourth gain control voltage signals.

10. A gain control circuit device of claim 9, wherein a sum of collector currents of the third and fourth transistors of the second gain control circuit is equal to a sum of collector currents of the first and second transistors of the first gain control circuit.

11. A gain control circuit device of claim 9, further comprising a constant current source connected to the input terminal of the first gain control circuit.

12. A gain control circuit device of claim 11, further comprising a fifth transistor having a collector connected to the input terminal and an emitter connected to the constant current source.

13. A gain control circuit device of claim 12, further comprising a grounded capacitor connected between the high frequency blocking element and the emitter of said one of said first and second transistors.

14. A gain control circuit device of claim 13, wherein said high frequency blocking element includes a choke coil.

15. A gain control circuit device of claim 13, wherein said high frequency blocking element includes a resistor.

16. A gain control circuit device of claim 13, wherein said high frequency blocking element includes a transistor.

17. A gain control circuit device, comprising: a first gain control circuit including:
first and second transistors having emitters connected to each other and to a first input terminal, collectors connected to a first output terminal, and bases connected to receive first and second gain control voltage signals, respectively,
third and fourth transistors having emitters connected to each other and to a second input terminal, collectors connected to a second output terminal, and bases connected to receive said second and first gain control voltage signals, respectively,
a first high frequency blocking element connected between the collector of one of the first and second transistors and the first output terminal, and
a second high frequency blocking element connected between the collector of one of the third and fourth transistors and the second output terminal; and a second gain control circuit including:
fifth and sixth transistors having emitters connected to each other and to the first output terminal, collectors connected to a power supply, and bases connected to receive third ad fourth gain control voltage signals, respectively,
seventh and eighth transistors having emitters connected to each other and to the second output terminal, collectors connected to said power supply, and bases connected to receive said fourth and third gain control voltage signals, respectively,
a load resistor connected between the collector of one of the seventh and eighth transistors and the power supply, and
a third output terminal located between the load resistor and the collector of said one of said seventh and eighth transistors;
wherein a gain of an output signal on the third output terminal is altered by varying one or more of the first, second, third and fourth gain control voltage signals.

18. A gain control circuit device of claim 17, further comprising a constant current source connected to the first and second input terminals of the first gain control circuit.

19. A gain control circuit device of claim 17, further comprising:
a ninth transistor having a collector connected to the first input terminal and an emitter connected to the constant current source; and
a tenth transistor having a collector connected to the second input terminal and an emitter connected to the constant current source.

20. A gain control circuit device of claim 17, further comprising:
a first grounded capacitor connected between the first high frequency blocking element and the emitter of said one of said first and second transistors; and
a second grounded capacitor connected between the second high frequency blocking element and the emitter of said one of said third and fourth transistors.

21. A gain control circuit device of claim 20, wherein said first and second high frequency blocking elements include choke coils.

22. A gain control circuit device of claim 20, wherein said first and second high frequency blocking element include resistors.

23. A gain control circuit device of claim 20, wherein said first and second high frequency blocking elements include transistors.

24. A gain control circuit device of claim 17 wherein the collector of the second transistor is connected to the collector of the third transistor.

* * * * *